United States Patent
Sato et al.

(10) Patent No.: US 9,698,125 B2
(45) Date of Patent: Jul. 4, 2017

(54) POWER MODULE WITH A PLURALITY OF PATTERNS WITH CONVEX AND CONCAVE SIDE

(71) Applicant: Renesas Electronics Corporation, Tokyo (JP)

(72) Inventors: Yukihiro Sato, Tokyo (JP); Katsuhiko Funatsu, Tokyo (JP); Takamitsu Kanazawa, Tokyo (JP); Masahiro Koido, Tokyo (JP); Hiroyoshi Taya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 1 day.

(21) Appl. No.: 14/863,837

(22) Filed: Sep. 24, 2015

(65) Prior Publication Data
US 2016/0093589 A1 Mar. 31, 2016

(30) Foreign Application Priority Data

Sep. 30, 2014 (JP) .................................. 2014-199925

(51) Int. Cl.
*H01L 23/48* (2006.01)
*H01L 21/44* (2006.01)
(Continued)

(52) U.S. Cl.
CPC ...... *H01L 25/0655* (2013.01); *H01L 21/4846* (2013.01); *H01L 23/049* (2013.01);
(Continued)

(58) Field of Classification Search
CPC ....... H01L 25/072; H01L 24/09; H01L 24/49; H01L 23/4846; H01L 23/049;
(Continued)

(56) References Cited

U.S. PATENT DOCUMENTS 8,125,080 B2 * 2/2012 Lee ..................... H01L 23/3121
257/724
2009/0127691 A1 * 5/2009 Lee ..................... H01L 23/3121
257/691
(Continued)

FOREIGN PATENT DOCUMENTS

DE 10 2010 006 850 A1 8/2011
JP 2001-085611 A 3/2001
(Continued)

OTHER PUBLICATIONS

Extended European Search Report received in corresponding European Application No. 15187045.8 dated Mar. 23, 2016.

*Primary Examiner* — Alonzo Chambliss
(74) *Attorney, Agent, or Firm* — Mattingly & Malur, PC

(57) ABSTRACT

Reduction in reliability of a semiconductor device is suppressed. A semiconductor device includes a plurality of metal patterns formed on a ceramic substrate, and a plurality of semiconductor chips mounted on the plurality of metal patterns. Also, the plurality of metal patterns include metal patterns MPH and MPU which face each other. In addition, a region which is provided between these metal patterns MPH and MPU and which is exposed from the plurality of metal patterns extends so as to zigzag along an extending direction of the metal pattern MPH.

17 Claims, 13 Drawing Sheets

(51) Int. Cl.
  *H01L 25/065* (2006.01)
  *H01L 23/498* (2006.01)
  *H01L 25/07* (2006.01)
  *H01L 23/00* (2006.01)
  *H01L 23/049* (2006.01)
  *H01L 21/48* (2006.01)
  *H01L 23/373* (2006.01)
  *H01L 25/16* (2006.01)
  *H01L 25/18* (2006.01)
  *H02M 7/219* (2006.01)
  *H01L 23/24* (2006.01)

(52) U.S. Cl.
  CPC .. *H01L 23/49838* (2013.01); *H01L 23/49844* (2013.01); *H01L 24/09* (2013.01); *H01L 24/49* (2013.01); *H01L 25/072* (2013.01); *H01L 23/24* (2013.01); *H01L 23/3735* (2013.01); *H01L 23/49861* (2013.01); *H01L 24/45* (2013.01); *H01L 25/16* (2013.01); *H01L 25/18* (2013.01); *H01L 2224/0603* (2013.01); *H01L 2224/0905* (2013.01); *H01L 2224/32225* (2013.01); *H01L 2224/45014* (2013.01); *H01L 2224/45124* (2013.01); *H01L 2224/45139* (2013.01); *H01L 2224/45144* (2013.01); *H01L 2224/4846* (2013.01); *H01L 2224/48227* (2013.01); *H01L 2224/48472* (2013.01); *H01L 2224/49111* (2013.01); *H01L 2224/49113* (2013.01); *H01L 2224/49175* (2013.01); *H01L 2224/73265* (2013.01); *H01L 2224/92247* (2013.01); *H01L 2924/13055* (2013.01); *H01L 2924/13091* (2013.01); *H01L 2924/16151* (2013.01); *H01L 2924/16251* (2013.01); *H01L 2924/181* (2013.01); *H02M 7/219* (2013.01)

(58) Field of Classification Search
  CPC ......... H01L 23/49838; H01L 23/49844; H01L 25/0655; H01L 21/4846
  See application file for complete search history.

(56) References Cited

U.S. PATENT DOCUMENTS

2009/0140369 A1*  6/2009  Lee ................ H01L 23/3107
                                                    257/467
2011/0075451 A1*  3/2011  Bayerer ............. H01L 24/06
                                                    363/37

FOREIGN PATENT DOCUMENTS

JP    2003-332481 A    11/2003
JP    2011-077087 A    4/2011

* cited by examiner

US 9,698,125 B2

POWER MODULE WITH A PLURALITY OF PATTERNS WITH CONVEX AND CONCAVE SIDE

CROSS-REFERENCE TO RELATED APPLICATION

The present application claims priority from Japanese Patent Application No. 2014-199925 filed on Sep. 30, 2014, the content of which is hereby incorporated by reference into this application.

TECHNICAL FIELD OF THE INVENTION

The present invention relates to a semiconductor device, and relates to a technique effectively applied to, for example, a semiconductor device on which a plurality of semiconductor chips are mounted on a ceramic substrate through a plurality of metal patterns.

BACKGROUND OF THE INVENTION

Japanese Patent Application Laid-Open Publication No. 2001-85611 (Patent Document 1) describes a power module in which a plurality of power elements are mounted on a ceramic substrate through a plurality of conductive layers.

Also, Japanese Patent Application Laid-Open Publication No. 2003-332481 (Patent Document 2) and Japanese Patent Application Laid-Open Publication No. 2011-77087 (Patent Document 3) describe a semiconductor module substrate obtained by bonding a copper plate for a wiring circuit onto an upper surface of the ceramic substrate and a copper plate for heat release onto a lower surface of the ceramic substrate.

SUMMARY OF THE INVENTION

There is a semiconductor device having a plurality of semiconductor chips mounted on a ceramic substrate through a conductive pattern. Since the ceramic substrate has excellent high-frequency characteristics and thermal conductivity, the ceramic substrate is used in, for example, a semiconductor device of power system (power control system) such as a power conversion device.

However, when a plurality of semiconductor chips are arranged inside one semiconductor device, a planar area of the ceramic substrate becomes large. It has been found out that this case has a risk of occurrence of damage such as crack on the ceramic substrate due to external force when the external force is applied onto the ceramic substrate in attachment of a semiconductor device or others.

Other object and novel characteristics will be apparent from the description of the present specification and the accompanying drawings.

A semiconductor device according to an embodiment includes a plurality of metal patterns formed on a ceramic substrate, and a plurality of semiconductor chips mounted on the plurality of metal patterns. In addition, the plurality of metal patterns include a first metal pattern and a second metal pattern which face each other. Also, a first region which is provided between the first metal pattern and the second metal pattern and which is exposed from the plurality of metal patterns extends so as to zigzag along an extending direction of the first metal pattern.

According to the above-described embodiment, the reliability of the semiconductor device can be improved.

BRIEF DESCRIPTIONS OF THE DRAWINGS

Figure 1:
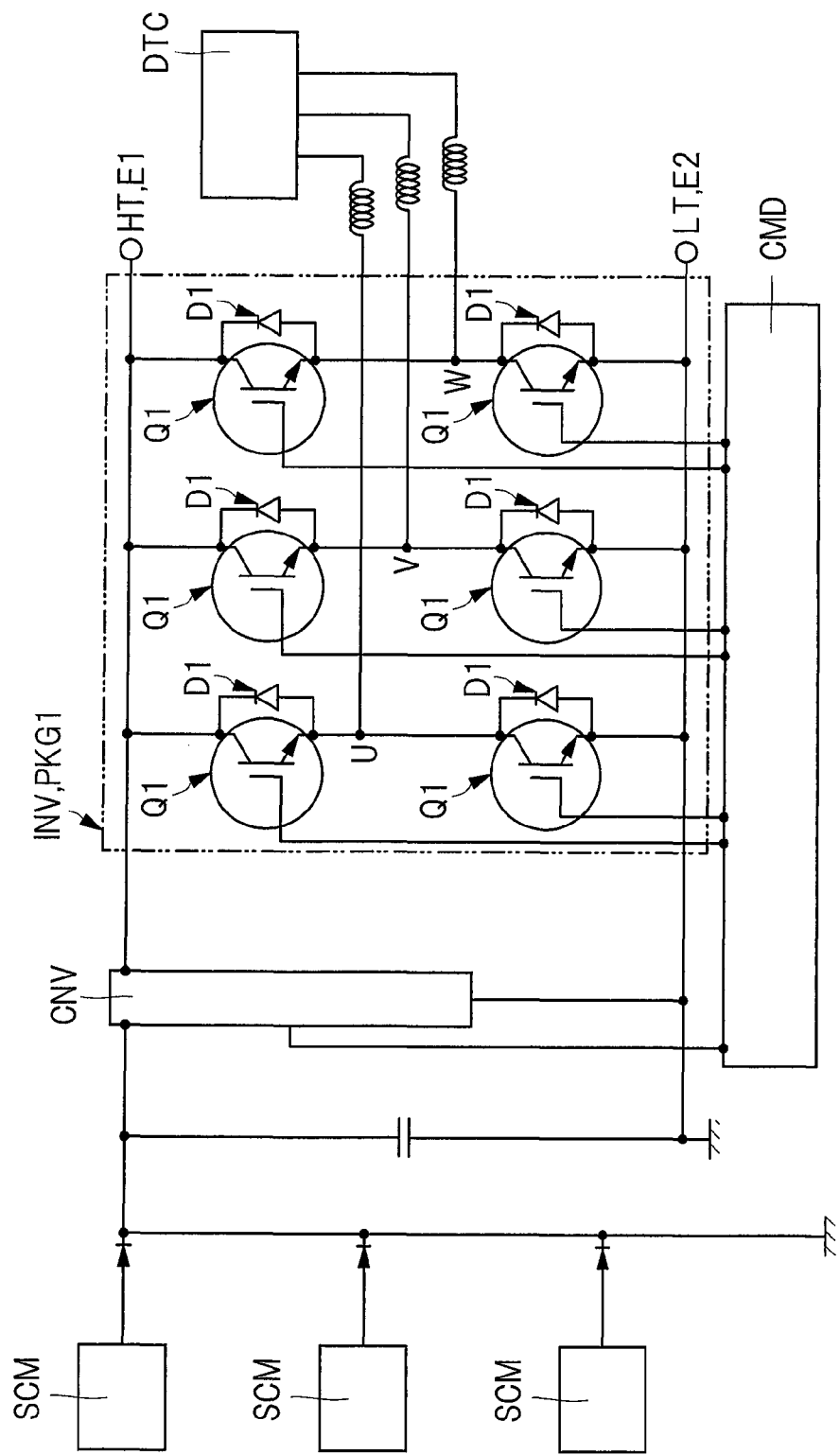
FIG. 1 is an explanatory diagram illustrating a configuration example of a power conversion system in which a semiconductor device according to an embodiment is embedded.

DESCRIPTIONS OF THE PREFERRED EMBODIMENTS (Description of Format, Basic Terms, and Usage in Present Application)

In the present application, the description of embodiments is divided into a plurality of sections for convenience as needed. However, unless otherwise indicated specifically, these are mutually independent and separated, and are each part of a single example, or one of them is a detailed part of the other or is all or partial modification, regardless before and after the description. In addition, in practice, repetitive descriptions of the same parts will be omitted. In addition, unless otherwise indicated specifically, each element of an embodiment is not essential, except for a case where the number thereof is limited in theory and a case that is clearly otherwise from the content.

Similarly, in the description of embodiments or others, the expression "X including A" in a material, a composition, or others does not exclude those including components other than A, unless otherwise indicated specifically and except for a case indicating clearly that they are not so from the context. For example, as for a component, it means "X including A as a main component". For example, even when a "silicon member" or others is mentioned, it is needless to say that this mention is not limited to pure silicon, and that this mention includes also a silicon germanium (SiGe) alloy, a multi-element alloy containing other silicon as a main component, and a member containing other additives or others. In addition, even when gold plating, a Cu layer, nickel plating, or others is mentioned, these mentions include not only a pure member but also members containing gold, Cu, nickel, or others as main components, respectively, unless otherwise indicated specifically.

Furthermore, even when a specific value or amount is mentioned, it may be a value larger than the specific value or a value smaller than the specific value unless otherwise indicated specifically and except for a case that the number thereof is logically limited to the specific value and a case that the number thereof is clearly not so from the context.

In addition, in each drawing of the embodiments, the same or similar parts are denoted by the same or similar symbols or reference numerals, and descriptions thereof are not repeated in principle.

In addition, in the attached drawings, hatching or others may be omitted even in a cross section in a case where it becomes complicated by the hatching or a case that a discrimination from a void is clear. In this regard, an outline of a background may be omitted even in a planarly closed hole in a case the explanation thereof or others is clear. Furthermore, even not for the cross section, hatching or dot patterns may be. attached so as to clarify there are no voids or clarify a boundary of a region.

<Configuration Example of Power Conversion System>

In the present embodiment to be described below in detail with reference to the drawings, as an example of a semiconductor device in which a plurality of semiconductor chips are mounted on a ceramic substrate, a power conversion device (inverter device) that converts input direct-current power into alternate-current power will be exemplified and described.

FIG. 1 is an explanatory diagram illustrating a configuration example of a power conversion system in which a semiconductor device of the present embodiment is embedded.

The power conversion system illustrated in FIG. 1 converts direct-current power, which is output from a plurality of solar cell modules SCM, into alternate-current power by an inverter circuit INV and outputs the alternate-current power to a power distribution circuit DTC.

Each of the plurality of solar cell modules SCM is a photoelectric conversion device that converts light energy into electrical energy. Each of the plurality of solar cell modules SCM includes a plurality of solar cells and outputs power converted into electrical energy in each of the plurality of solar cells as a direct-current power.

In addition, a converter circuit CNV is connected between the plurality of solar cell modules SCM and the inverter circuit INV illustrated in FIG. 1. In the example illustrated in FIG. 1, the direct-current power, which is output from the plurality of solar cell modules SCM, is boosted to high-voltage direct-current power by the converter circuit CNV. That is, the converter circuit CNV illustrated in FIG. 1 is a so-called DC/DC converter that converts a direct-current power into a relatively high-voltage direct-current power.

In addition, the alternate-current power, which is power-converted by the inverter circuit INV, is output to the power distribution circuit DTC. In the example illustrated in FIG. 1, by the inverter circuit INV, the power is converted into three-phase alternate-current power having U-phase, V-phase, and W-phase and outputs the three-phase alternate-current power to the power distribution circuit DTC.

In addition, the power conversion system illustrated in FIG. 1 includes a control circuit CMD that controls the above-described power conversion operation. The control circuit CMD outputs a control signals to each switching element of the converter circuit CNV and the inverter circuit INV.

In addition, the inverter circuit INV illustrated in FIG. 1 is a power conversion circuit that converts a direct-current power into an alternate-current power by using a plurality of switching elements. In the example illustrated in FIG. 1, each of six transistors Q1 functions as a switching element.

When the direct-current power is converted to the alternate-current power by using the switching elements, a circuit is used, the circuit having a high-side switch connected to a relatively high potential and a low-side switch connected to a relatively low potential which are connected in series. The high-side switch and the low-side switch are paired to be turned on/off. When one switch of the pair of the high-side switch and the low-side switch is turned on, the other switch is turned off. The pair of the high-side switch and the low-side switch are turned on/off (hereinafter, referred to as a switching operation) at a high speed, so that a single-phase alternate-current power is output.

In addition, in the example illustrated in FIG. 1, the inverter circuit INV that converts the direct-current power into the three-phase alternate-current power is described so that three switch pairs each including a high-side switch and a low-side switch are provided so as to correspond to the three phases of the U-phase, the V-phase, and the W-phase. In addition, an output node of each of the three phases of the U-phase, the V-phase, and the W-phase, is connected between the high-side switch and the low-side switch which are connected in series, and each of the switch pairs performs a switching operation so as to have a phase difference of 120 degrees. In this manner, the direct-current power can be converted into the three-phase alternate-current power having the three phases of the U-phase, the V-phase, and the W-phase.

For example, in the example illustrated in FIG. 1, a positive potential E1 is applied to a high-side terminal HT, and a potential E2 is applied to a low-side terminal LT. At this time, a potential of each of a U-phase node, a V-phase node, and a W-phase node changes to 0 and E1 in accordance with the switching operations of three sets of the switching pairs. Then, for example, a line voltage between the U-phase and the V-phase is obtained by subtracting a V-phase potential from a U-phase potential, and therefore, the line voltage changes to +E1 [V], 0 [V], and −E1 [V]. In addition, a line voltage between the V-phase and the W-phase has a voltage waveform whose phase is shifted by 120 degrees with respect to the line voltage between the U-phase and the V-phase, and besides, a line voltage between a W-phase and a U-phase has a voltage waveform whose phase is shifted by 120 degrees with respect to the line voltage between the V-phase and the W-phase. That is, when the direct-current power is input to the inverter circuit INV, the voltage waveform of the three-phase alternate-current power is obtained.

In addition, a transistor Q1 configuring the switching element of the inverter circuit INV illustrated in FIG. 1 is an insulated gate bipolar transistor (hereinafter, referred to as IGBT). As the transistor Q1 that is the switching element, a power metal oxide semiconductor field effect transistors (MOSFET) may be used. Since the power MOSFET is a voltage-driven type that controls the switching operation by a voltage applied to a gate electrode, the power MOSFET has an advantage that can perform high-speed switching.

However, the power MOSFET has properties that an on-resistance becomes higher as increase in a breakdown voltage is more achieved, which results in a higher heat generation amount. Therefore, the IGBT is preferable as the transistor Q1 that is used in applications requiring high-power and high-speed switching operations. The IGBT is a semiconductor device that is configured by a combination of a power MOSFET and a bipolar transistor and has both of the high-speed switching characteristics of the power MOSFET and the high breakdown characteristics of the bipolar transistor. As described above, the inverter circuit INV according to the first embodiment adopts the IGBT as the switching element.

In addition, in the inverter circuit INV, a transistor Q1 and a diode D1 are connected in antiparallel between the high-side terminal HT and each phase (U-phase, V-phase, and W-phase) of the three-phase alternate-current, and a transistor Q1 and a diode D1 are connected in antiparallel between each phase of the three-phase alternate-current and the low-side terminal LT. That is, two transistors Q1 and two diodes D1 are provided in each single-phase, and six transistors Q1 and six diodes D1 are provided in three phases. The control circuit CMD is connected to a gate electrode of the individual transistor Q1, and the switching operation of the transistor Q1 is controlled by the control circuit CMD. The diode D1 has a function of supplying a reflux current for releasing electrical energy accumulated in an inductance connected to an output side of the inverter circuit INV.

<Semiconductor Device>

Figure 2:
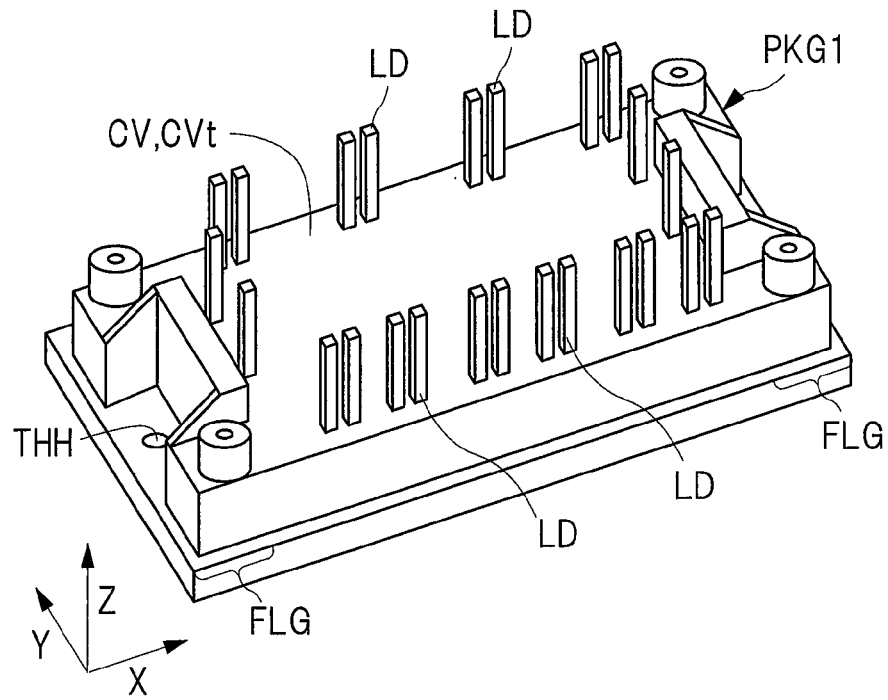
FIG. 2 is a perspective view illustrating an appearance of the semiconductor device illustrated in FIG. 1.
Figure 3:
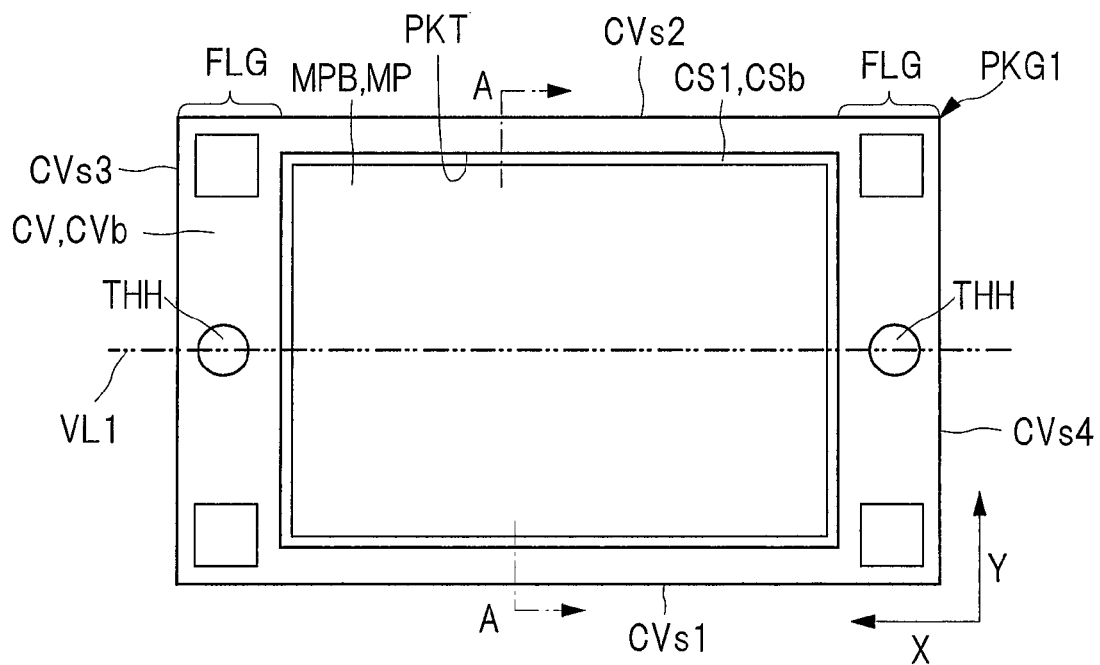
FIG. 3 is a plan view illustrating a rear surface side of the semiconductor device illustrated in FIG. 2.
Figure 4:
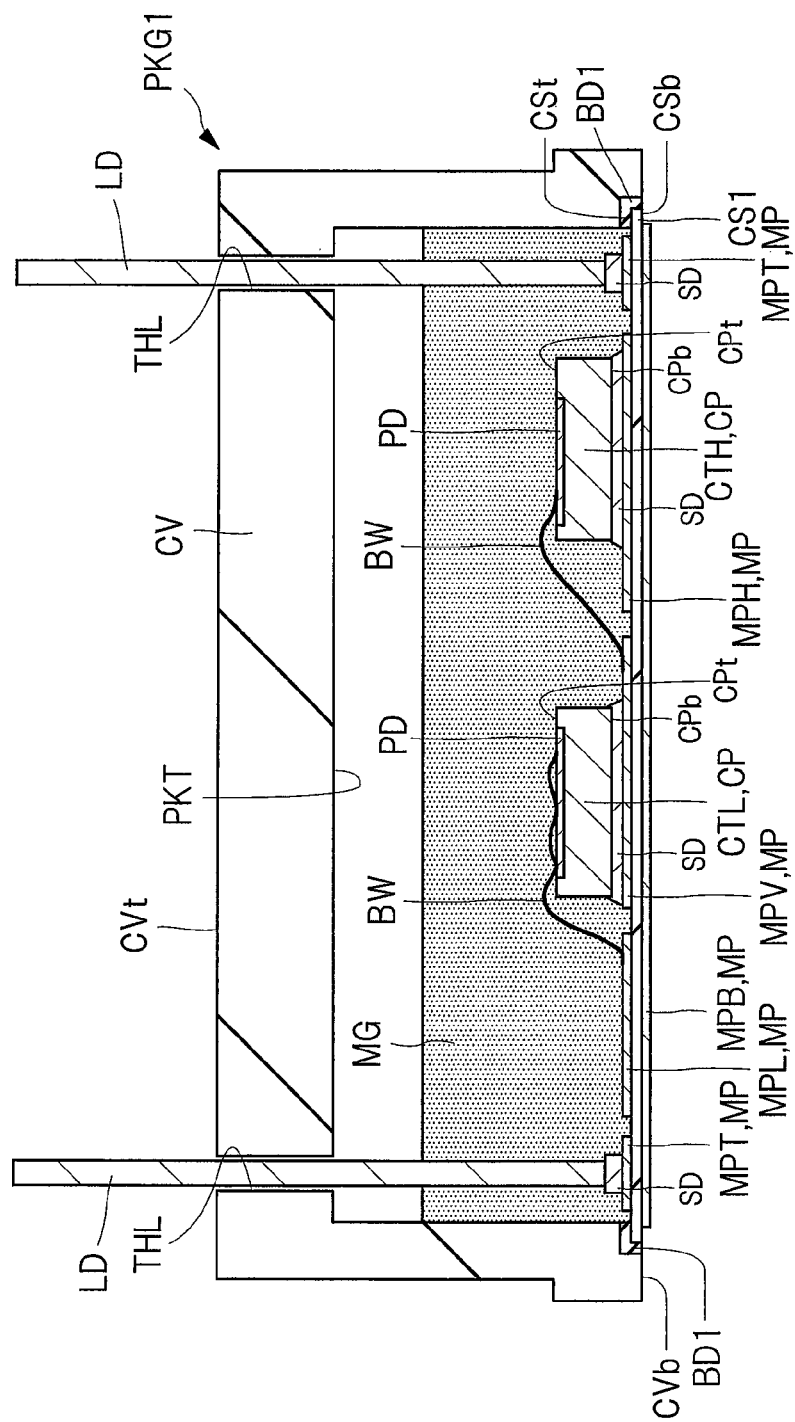
FIG. 4 is a cross-sectional view taken along a line A-A of FIG. 3.
Figure 5:
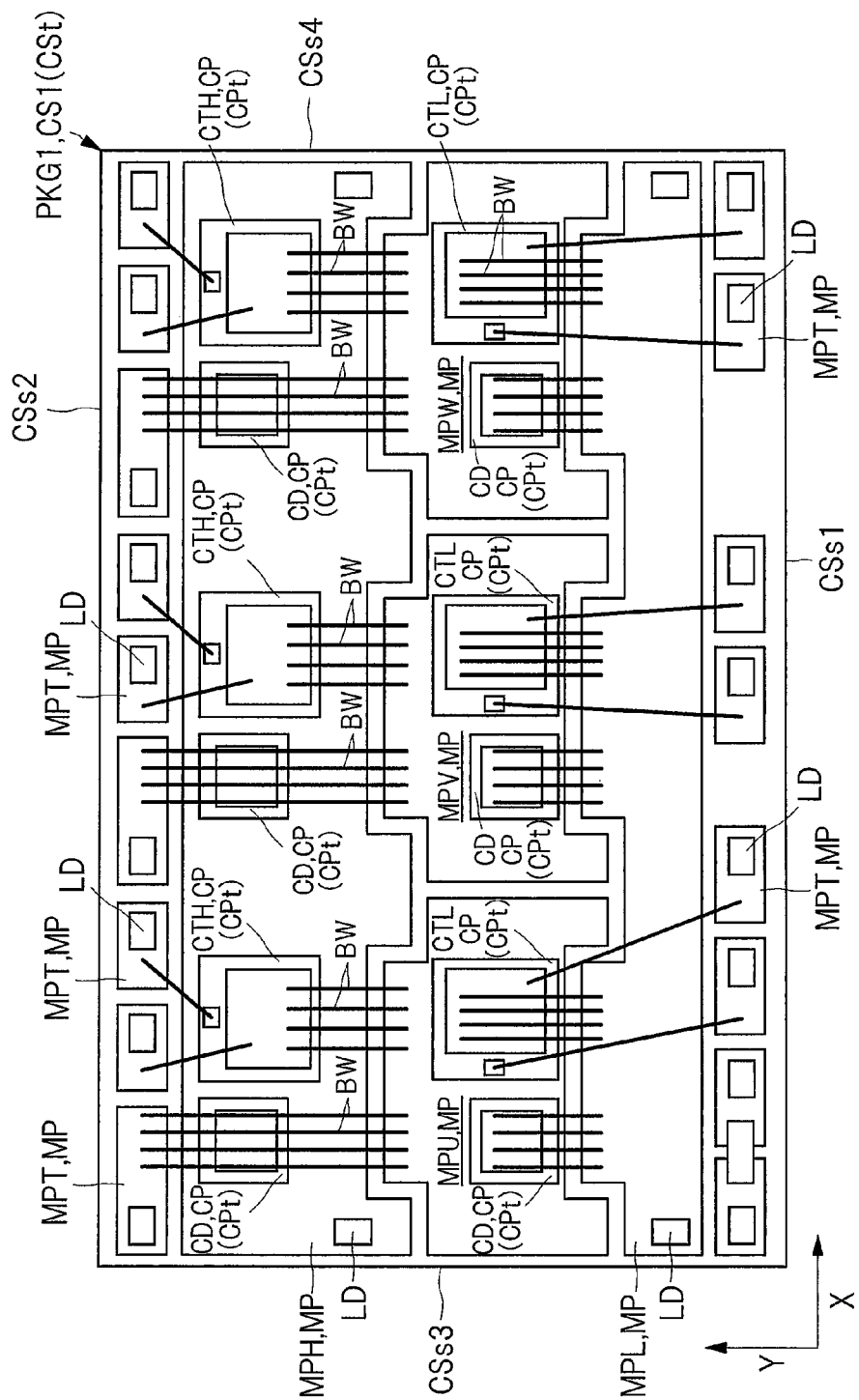
FIG. 5 is a plan view illustrating a layout of a top surface side of a ceramic substrate illustrated in FIG. 3.
Figure 6:
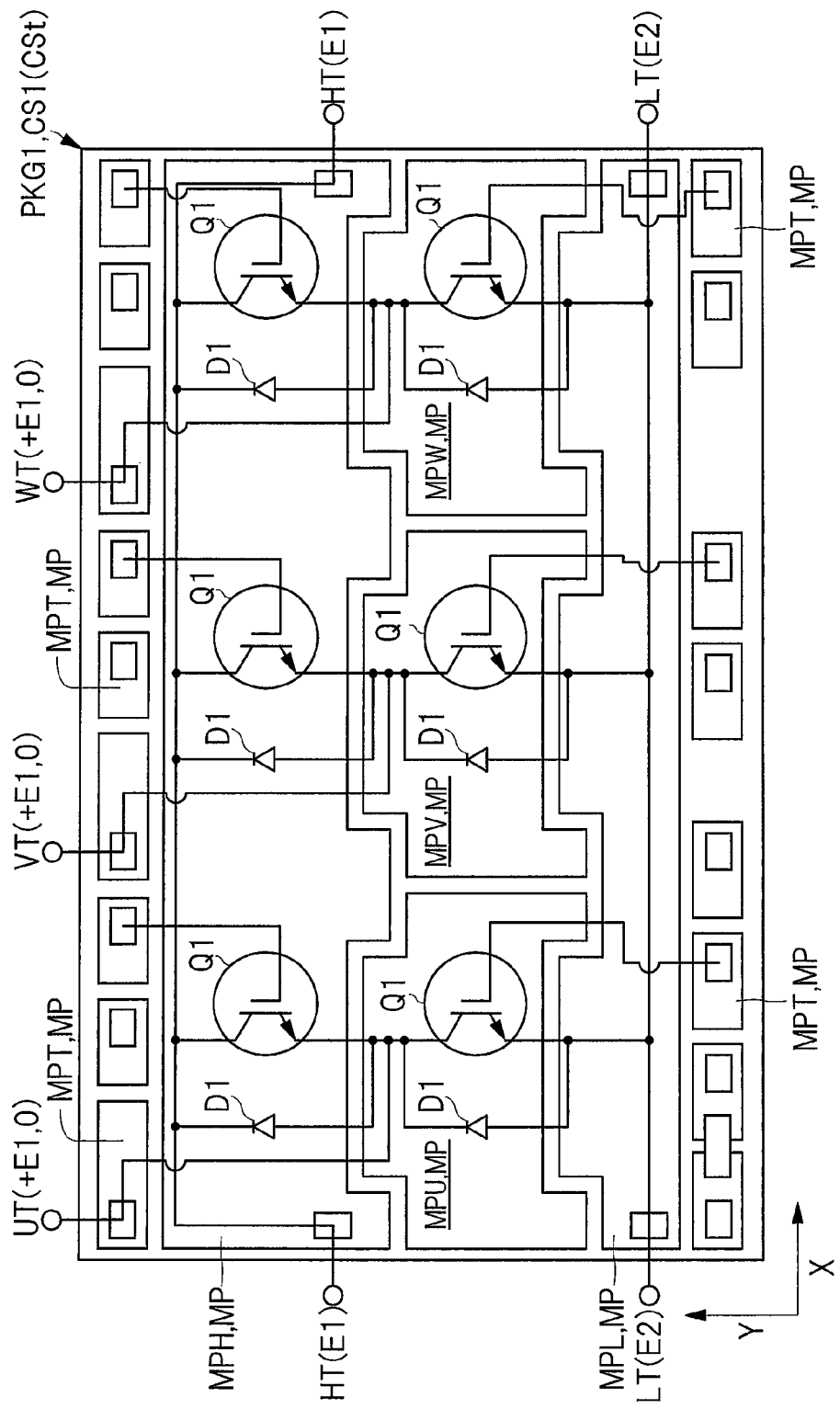
FIG. 6 is an explanatory diagram schematically illustrating an inverter circuit configured by a plurality of semiconductor chips illustrated in FIG. 5.
Figure 7:
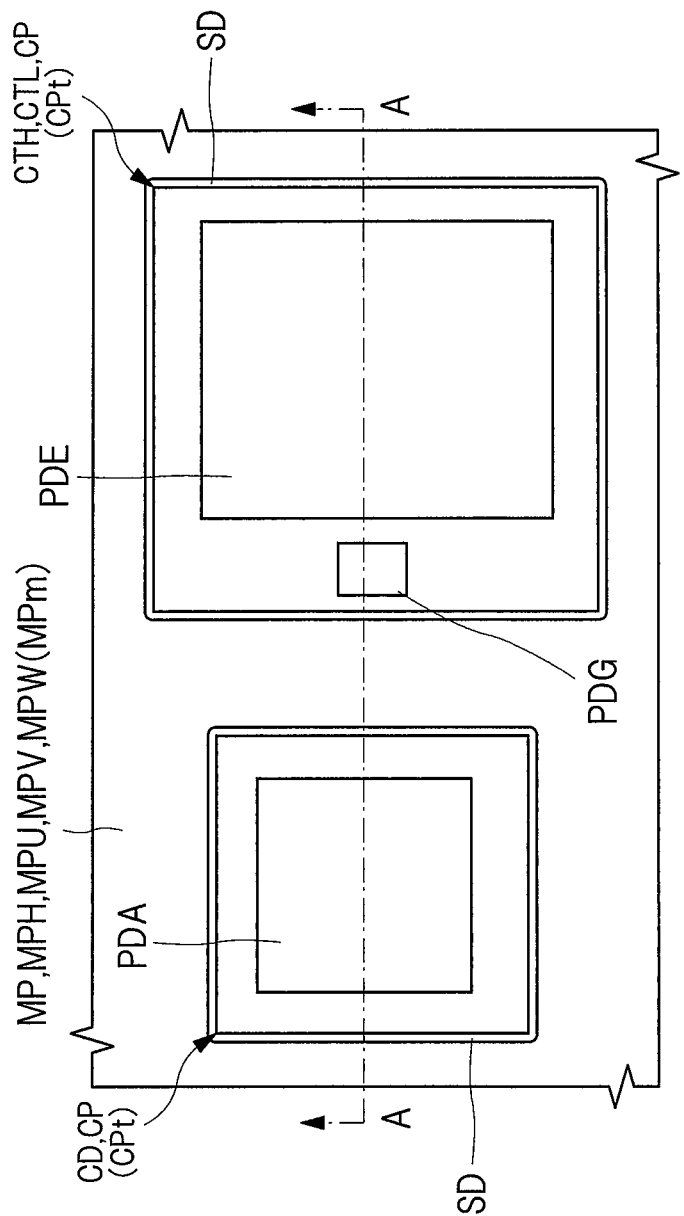
FIG. 7 is an enlarged plan view illustrating a periphery of the semiconductor chip illustrated in FIG. 5 so as to be enlarged.
Figure 8:
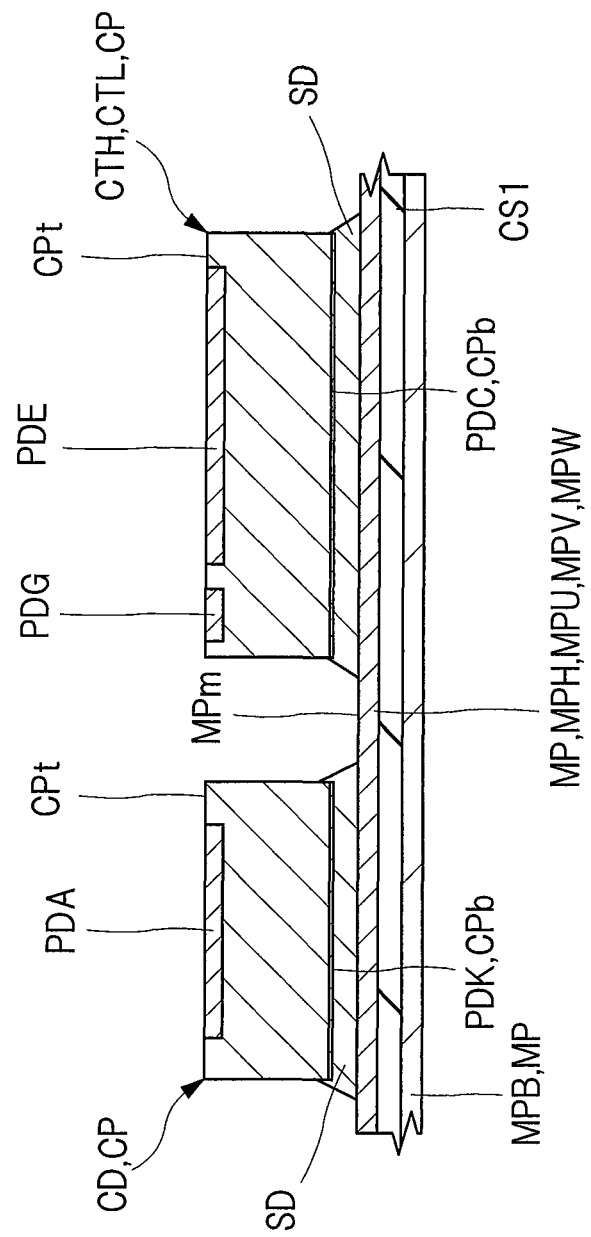
FIG. 8 is an enlarged cross-sectional view taken along a line A-A of FIG. 7.

Next, a configuration example of a semiconductor device PKG1 configuring the inverter circuit INV illustrated in FIG. 1 will be described. FIG. 2 is a perspective view illustrating an appearance of the semiconductor device illustrated in FIG. 1. In addition, FIG. 3 is a plan view illustrating a rear surface side of the semiconductor device illustrated in FIG. 2. In addition, FIG. 4 is a cross-sectional view taken along a line A-A of FIG. 3. In addition, FIG. 5 is a plan view illustrating a layout of a top surface side of a ceramic substrate illustrated in FIG. 3. In addition, FIG. 6 is an explanatory diagram schematically illustrating a circuit configured by the semiconductor device illustrated in FIG. 5. In addition, FIG. 7 is an enlarged plan view illustrating a periphery of a semiconductor chip illustrated in. FIG. 5 so as to be enlarged. In addition, FIG. 8 is an enlarged cross-sectional view taken along a line A-A of FIG. 7.

Note that FIG. 7 illustrates one semiconductor chip CP including a transistor and one semiconductor chip CD including a diode as a typical example of a plurality of semiconductor chips CP illustrated in FIG. 5. Since a semiconductor chip CTH and a semiconductor chip CTL illustrated in FIG. 5 have the same structure, one semiconductor chip CP is typically illustrated.

As illustrated in FIG. 2, the top surface side of the semiconductor device PKG1 of the present embodiment, which configures the inverter circuit INV illustrated in FIG. 1, is covered with a cover member (a cap or a cover member). As illustrated in FIG. 4, the cover member CV includes an accommodation portion (pocket) PKT that accommodates a plurality of semiconductor chips CP. The cover member CV covers a top surface CSt of a ceramic substrate CS1 that is a substrate on which a plurality of semiconductor chips CP is mounted. A peripheral portion of the top surface CSt of the ceramic substrate CS1 is adhered and fixed to the cover member CV through an adhesive BD1. The cover member CV is a resin member and is made of, for example, an epoxy-based resin.

In addition, a plurality of terminals LD protrude from a top surface CVt of the cover member CV. A plurality of through-holes THL are formed on the top surface CVt of the cover member CV, and the plurality of terminals LD are inserted into the plurality of through-holes THL, respectively. The plurality of terminals LD are external terminals of the semiconductor device PKG1 and are electrically connected to the plurality of semiconductor chips CP mounted on the ceramic substrate CS1 illustrated in FIG. 5, respectively.

In addition, as illustrated in FIG. 3, when seen in a plan view, the cover member CV of the semiconductor device PKG1 has a side CVs1 extending along an X direction, a side CVs2 located on an opposite side of the side CVs1, a side CVs3 extending along a Y direction perpendicular to the X direction, and a side CVs4 located on an opposite side of the side CVs3. In addition, the side CVs1 and the side CVs2 are longer than the side CVs3 and the side CVs4. In the example illustrated in FIG. 3, note that the cover member CV of the semiconductor device PKG1 forms a quadrangle (a rectangle in FIG. 3) when seen in a plan view. However, as the planar shape of the semiconductor device PKG1, there are various modification examples other than the quadrangle. For example, a pentagon may be obtained by cutting an intersection point, at which the side CVs3 and the side CVs1 intersects with each other among four corners of the quadrangle, diagonally to the X direction and the Y direction. In this case, the diagonally-cut corner can be used as an alignment mask for identifying orientation of the semiconductor device PKG1.

In addition, as illustrated in FIGS. 2 and 3, the cover member CV has a flange portions FLG that is an attachment part for fixing the semiconductor device PKG1 to, for example, a heat sink, a support member, or others. As illustrated in FIG. 3, the flange portion FLG is provided on both sides of the accommodation portion PKT along the X direction that is a longitudinal direction. In addition, a through-hole THH is formed in each of the centers of the plurality of flange portions FLG. The through-hole THH is an opening that penetrates through the flange portion FLG of the cover member CV in a thickness direction. When the semiconductor device PKG1 is fixed to, for example, the heat sink, the support member, or others, the semiconductor device PKG1 can be fixed by screws by inserting the screws (not illustrated) into the through-holes THH.

In the example illustrated in FIG. 3, two through-holes THH are formed along a virtual line VL1 extending along the X direction that is the longitudinal direction. However, there are various modification examples in a formation position of the through-hole THH. For example, the through-hole THH may be provided at each of four corners of the cover member CV on a bottom surface CVb side illustrated in FIG. 3.

Next, the ceramic substrate CS1 accommodated in the accommodation portion PKT of the cover member CV of the semiconductor device PKG1 and each member fixed to the ceramic substrate CS1 will be described.

As illustrated in FIGS. 4 and 5, the semiconductor device PKG1 includes a ceramic substrate CS1, a plurality of metal patterns MP formed on a top surface CSt of the ceramic substrate CS1, and a plurality of semiconductor chips CP mounted on some of the plurality of metal patterns MP.

As illustrated in FIG. 4, the ceramic substrate CS1 has the top surface CSt that is a chip mounting surface on which the plurality of semiconductor chips CP are mounted, and a bottom surface CSb located on an opposite side of the top surface CSt. The ceramic substrate CS1 is made of a ceramic material. In the present embodiment, the ceramic substrate CS1 is a plate-shaped member made of, for example, alumina (aluminum oxide: $Al_2O_3$).

As illustrated in FIG. 5, when seen in a plan view, the ceramic substrate CS1 has a substrate side CSs1 extending along the X direction, a substrate side CSs2 located on an opposite side of the substrate side CSs1, a substrate side CSs3 extending along the Y direction perpendicular to the X direction, and a substrate side CSs4 located on an opposite side of the substrate side CSs3. In addition, the substrate side CSs1 and the substrate side CSs2 are relatively longer than the substrate side CSs3 and the substrate side CSs4. In the example illustrated in FIG. 5, the ceramic substrate CS1 forms a quadrangle (a rectangle in FIG. 5) when seen in a plan view.

In addition, as illustrated in FIG. 4, the plurality of metal patterns MP are bonded to the top surface CSt and the bottom surface CSb of the ceramic substrate CS1. The plurality of metal patterns MP are, for example, a laminated film in which a nickel (Ni) film is laminated on a surface of a copper (Cu) film so that the copper film is directly bonded to the top surface CSt or the bottom surface CSb of the ceramic substrate CS1. When the copper film is bonded to a plate member made of a ceramic such as alumina, the bonding is made by using an eutectic reaction. In addition, as a method of laminating the nickel film on the surface of the copper film, for example, an electroplating process can be used.

In addition, a metal pattern MPB disposed on the bottom surface CSb side of the ceramic substrate CS1 is a terminal for heat dissipation and is uniformly formed to cover a large portion of the bottom surface CSb of the ceramic substrate CS1.

In addition, as illustrated in FIG. 6, the plurality of metal patterns MP formed on the top surface CSt of the ceramic substrate CS1 are wiring patterns configuring a part of a wiring path of the inverter circuit INV, and the plurality of metal patterns MP separated from one another is formed.

The plurality of metal patterns MP includes a metal pattern MPH to which the high-side potential E1 is supplied. In addition, the plurality of metal patterns MP include a metal pattern MPL to which the low-side potential E2 which is lower than the potential E1 is supplied. In addition, the plurality of metal patterns MP include metal patterns MPU, MPV, and MPW to which a potential changing in accordance with the switching operation of the transistor Q1 is supplied. In addition, the plurality of metal patterns MP include a plurality of metal patterns MPT for connecting the terminal LD.

Different potentials are supplied to the metal pattern MPU, the metal pattern MPV, and the metal pattern MPW, respectively, so that the patterns MPU, MPV, and MPW have a phase difference of 120 degrees as described above. Therefore, the metal pattern MPU, the metal pattern MPV, and the metal pattern MPW are metal patterns MP separated from one another. In addition, the metal pattern MPU, the metal pattern MPV, and the metal pattern MPW are connected to the metal pattern MPT, on which the output terminal LD is mounted, through a plurality of wires BW as illustrated in FIG. 5. Therefore, the wire BW illustrated in FIG. 5 is included in a transmission path for the output of the U-phase, the V-phase, and the W-phase illustrated in FIG. 1.

In addition, in the metal pattern MPH, the same potential (high-side potential E1 (see FIG. 6)) is supplied to each of the U-phase, the V-phase, and the W-phase (see FIG. 1). Therefore, the metal pattern MPH is integrally formed without being divided in accordance with the difference of the U-phase, the V-phase, and the W-phase. In other words, the high-side potential E1 is supplied to each of the plurality of transistors Q1 without interposing the wire BW therebetween. As a modification example of FIG. 5, note that a method can be considered, the method dividing the metal pattern MPH illustrated in FIG. 5 in accordance with the difference of the U-phase, the V-phase, and the W-phase and electrically connecting the divided metal patterns MPH to one another through a conductive pattern (not illustrated) such as a wire. However, as in the present embodiment, by integrally forming the metal pattern MPH to which the same potential is supplied without dividing this, an impedance of a supply path of the potential E1 can be reduced. Therefore, electrical characteristics of the supply path of the potential E1 can be improved. In addition, the heat generation amount in the metal pattern MPH can be reduced.

In addition, in the metal pattern MPL, the same potential (low-side potential E2 (see FIG. 6)) is supplied to each of the U-phase, the V-phase, and the W-phase (see FIG. 1). Therefore, the metal pattern MPL is integrally formed without being divided in accordance with the difference of the U-phase, the V-phase, and the W-phase. As a modification example of FIG. 5, a method can be considered, the method dividing the metal pattern MPL illustrated in FIG. 5 in accordance with the difference of the U-phase, the V-phase, and the W-phase and electrically connecting the divided metal patterns MPL to one another through a conductive member (not illustrated) such as a wire. In the case of the low-side metal pattern MPL, as illustrated in FIG. 5, the semiconductor chip CP and the metal pattern MPL are electrically connected to each other through the wire BW. Therefore, even when the metal pattern MPL is integrally formed without being divided, the wire BW is not eliminated from the supply path of the potential E2 (see FIG. 6). However, since the supply path of the potential E2 can be stabilized by integrally forming the metal pattern MPL without division, the electrical characteristics of the supply path of the potential E2 can be improved. In addition, the heat generation amount caused when a reflux current flows through the metal pattern MPL can be reduced.

In addition, as illustrated in FIG. 5, one terminal LD is mounted on each of the plurality of metal patterns MPT among the plurality of metal patterns MP. In addition, a plurality of terminals LD are mounted in each of the metal pattern MPH and the metal pattern MPL among the plurality of metal patterns MP. In the example illustrated in FIG. 5, one terminal LD is mounted on each of the metal pattern MPH and the metal pattern MPL along the substrate side CSs3 and the substrate side CSs4, which are the short sides among the four sides of the top surface CSt of the ceramic substrate CS1.

In addition, as illustrated in FIG. 5, the terminal LD is not directly connected to each of the metal pattern MPU, the metal pattern MPV, and the metal pattern MPW among the plurality of metal patterns MP. In other words, the terminal LD is not mounted on each of the metal pattern MPU, the metal pattern MPV, and the metal pattern MPW. Each of the metal pattern MPU, the metal pattern MPV, and the metal pattern MPW is electrically connected to the metal pattern MPT through the plurality of wires BW. That is, each of the metal pattern MPU, the metal pattern MPV, and the metal pattern MPW is electrically connected to the terminal LD through the plurality of wires BW and the metal pattern MPT.

In addition, a plurality of semiconductor chips CP are mounted on some of the plurality of metal patterns MP (the metal pattern MPH, the metal pattern MPU, the metal pattern MPV, and the metal pattern MPW). Some of the plurality of semiconductor chips CP illustrated in FIG. 5 are semiconductor chips CTH and CTL for switching elements in which the transistors Q1 illustrated in FIG. 6 are formed. In the present embodiment, an IGBT is formed in each of the semiconductor chips CTH and CTL. In addition, other one of the plurality of semiconductor chips CP illustrated in FIG. 5 is a semiconductor chip CD in which the diode D1 illustrated in FIG. 6 is formed.

As described above, when an inductance is connected to the output side of the inverter circuit INV (see FIG. 6), the transistor Q1 (FIG. 6) that is a switching element is connected in antiparallel to the diode D1 (see FIG. 6). As in the MOSFET, when the circuit of the transistor Q1 performing the switching operation and the circuit of the diode D1 supplying the reflux current are embedded in one semiconductor chip CP, one semiconductor chip CP may be mounted in accordance with the number of the switching elements. However, when the IGBT is used as the transistor Q1, it is required to prepare separately the semiconductor chip CP for the diode D1. Therefore, in the present embodiment, as illustrated in FIG. 5, a set of the semiconductor chips CD each including the diode are mounted for the semiconductor chip CTH including the transistor for the high side and the semiconductor chip CTL including the transistor for the low side, respectively.

As illustrated in FIGS. 7 and 8, each of the plurality of semiconductor chips CP has a top surface CPt and a bottom surface CPb located on an opposite side of the top surface (see FIG. 8). The semiconductor chip CTH and the semiconductor chip CTL including the transistors include an electrode PDE for an emitter and an electrode PDG for a gate, which are exposed from the top surface CPt. In addition, the semiconductor chip CTH and the semiconductor chip CTL including the transistors include an electrode PDC for a collector in the bottom surface CPb. The electrode PDC for the collector is fixed to a top surface MPm of the metal pattern MP through a solder SD that is a bonding material. In addition, the electrode PDC for the collector is electrically connected to the metal pattern MP through the solder SD.

Specifically, as illustrated in FIG. 5, the plurality of semiconductor chips CTH are mounted on the metal pattern MPH. In other words, the electrode PDC for the collector (see FIG. 8) of the plurality of semiconductor chips CTH is electrically connected to the integrally-formed metal pattern MPH. In addition, one semiconductor chip CTL is mounted on each of the metal pattern MPU, the metal pattern MPV, and the metal pattern MPW. In other words, the electrode PDC for the collector (see FIG. 8) of the plurality of semiconductor chips CTL is electrically connected to each of the metal pattern MPU, the metal pattern MPV and the metal pattern MPW.

In addition, as illustrated in FIG. 5, a plurality of wires BW are connected to the electrode PDE. Specifically, as illustrated in FIG. 5, the electrode PDE of the high-side semiconductor chip CTH (see FIG. 7) is connected to one of the metal pattern MPU, the metal pattern MPV, and the metal pattern MPW through the plurality of wires BW. That is, the electrode PDE of the high-side semiconductor chip CTH is connected to one of a U-phase output terminal UT (see FIG. 6), a V-phase output terminal VT (see FIG. 6), and a W-phase output terminal WT (see FIG. 6). In addition, as illustrated in FIG. 5, the electrode PDE of the low-side semiconductor chip CTL (see FIG. 7) is connected to the metal pattern MPL through the plurality of wires BW. That is, the electrode PDE of the low-side semiconductor chip CTL is electrically connected to the terminal LT to which the low-side potential E2 illustrated in FIG. 6 is supplied.

In addition, as illustrated in FIG. 5, one wire BW is connected to the electrode PDG. Specifically, as illustrated in FIG. 5, each electrode PDG (see FIG. 7) included in each of the high-side semiconductor chip CTH and the low-side semiconductor chip CTL is electrically connected to the metal pattern MPT through the wire BW. A driving signal for driving the switching operation of the transistors Q1 (see FIG. 6) included in the semiconductor chip CTH and the semiconductor chip CTL is supplied from the metal pattern MPT.

In addition, as illustrated in FIGS. 7 and 8, the semiconductor chip CD with the diode includes an anode electrode PDA exposed from the top surface CPt. In addition, as illustrated in FIG. 8, the semiconductor chip CD includes a cathode electrode PDK in the bottom surface CPb. The cathode electrode PDK is fixed to the top surface MPm of the metal pattern MP through the solder SD that is the bonding material. In addition, the cathode electrode PDK is electrically connected to the metal pattern MP through the solder SD.

Specifically, as illustrated in FIG. 5, the plurality of semiconductor chips CD are mounted on the metal pattern MPH. In other words, the cathode electrodes PDK of the plurality of semiconductor chips CD (see FIG. 8) are electrically connected to the integrally-formed metal pattern MPH. In addition, one semiconductor chip CD is mounted on each of the metal pattern MPU, the metal pattern MPV, and the metal pattern MPW. In other words, the cathode electrode PDK of the semiconductor chip CD (see FIG. 8) is electrically connected to each of the metal pattern MPU, the metal pattern MPV, and the metal pattern MPW.

In addition, as illustrated in FIG. 5, a plurality of wires BW are connected to the electrode PDA. Specifically, as illustrated in FIG. 5, the electrode PDA of the high-side semiconductor chip CD (see FIG. 7) is connected to one of the metal pattern MPU, the metal pattern MPV, and the metal pattern MPW through the plurality of wires BW. In addition, the electrode PDA of the high-side semiconductor chip CD (see FIG. 7) is connected to the output metal pattern MPT through the plurality of wires BW. That is, the electrode PDA of the high-side semiconductor chip CD is connected to one of the U-phase output terminal UT (see FIG. 6), the V-phase output terminal VT (see FIG. 6), and the W-phase output terminal WT (see FIG. 6). In addition, as illustrated in FIG. 5, the electrode PDA of the low-side semiconductor chip CD (see FIG. 7) is connected to the metal pattern MPL through the plurality of wires BW. That is, the electrode PDA of the low-side semiconductor chip CD is electrically connected to the terminal LT to which the low-side potential E2 illustrated in FIG. 6 is supplied.

Each of the plurality of wires BW illustrated in FIG. 5 is a metal wire, and is made of, for example, aluminum in the present embodiment. However, there are various modification examples in the material of the wire BW so that not only aluminum but also gold or silver can be used.

In addition, as illustrated in FIG. 4, a sealing material MG is filled in a space between the cover member CV and the ceramic substrate CS1. Each of the plurality of semiconductor chips CP and each of the plurality of wires BW are sealed by the sealing material MG. The sealing material MG is a member that protects a part of the semiconductor chip CP, the wire BW, and the terminal LD. As the sealing member, there is a method of using a resin material such as an epoxy resin that is cured by heating so as to ensure a certain strength. However, by the curing of the sealing material MG, a stress is caused inside the semiconductor device PKG1 when a temperature cycle load is applied to the semiconductor device PKG1, because of a difference in a linear expansion coefficient between the ceramic substrate CS1 and the sealing material MG. Therefore, in the present embodiment, the sealing material MG is formed by using a softer resin material than the epoxy resin. Specifically, in the present embodiment, the sealing material MG is a silicone resin that is a polymer compound having a main skeleton formed by a siloxane bond.

The silicone resin has softer characteristics than the epoxy resin. The stress caused when the temperature cycle load is applied to the semiconductor device PKG1 is reduced by the deformation of the sealing material MG that is the silicone resin.

<Planar Shape of Metal Pattern>

Figure 9:
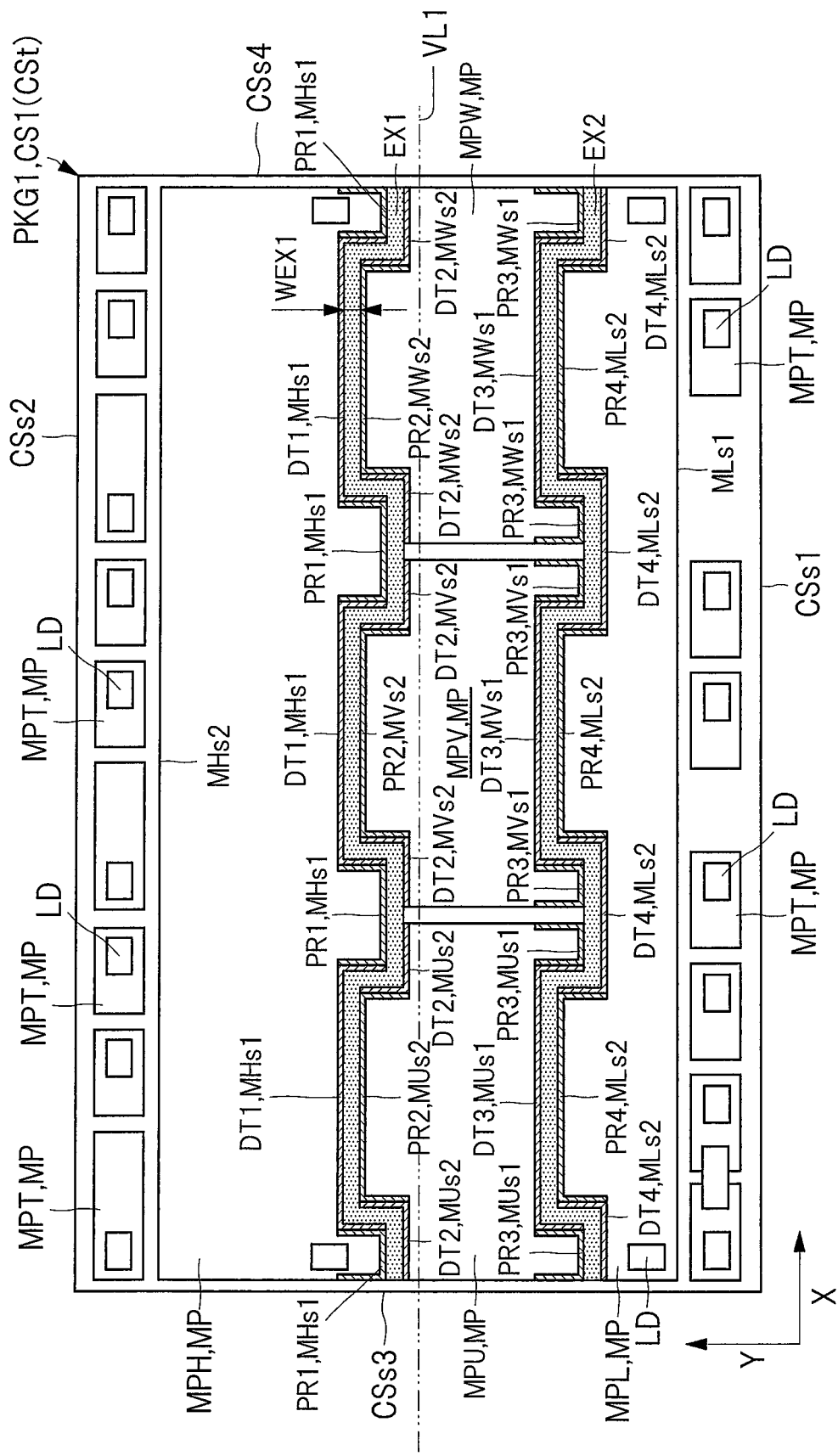
FIG. 9 is a plan view illustrating a layout of a plurality of metal patterns illustrated in FIG. 5.
Figure 14:
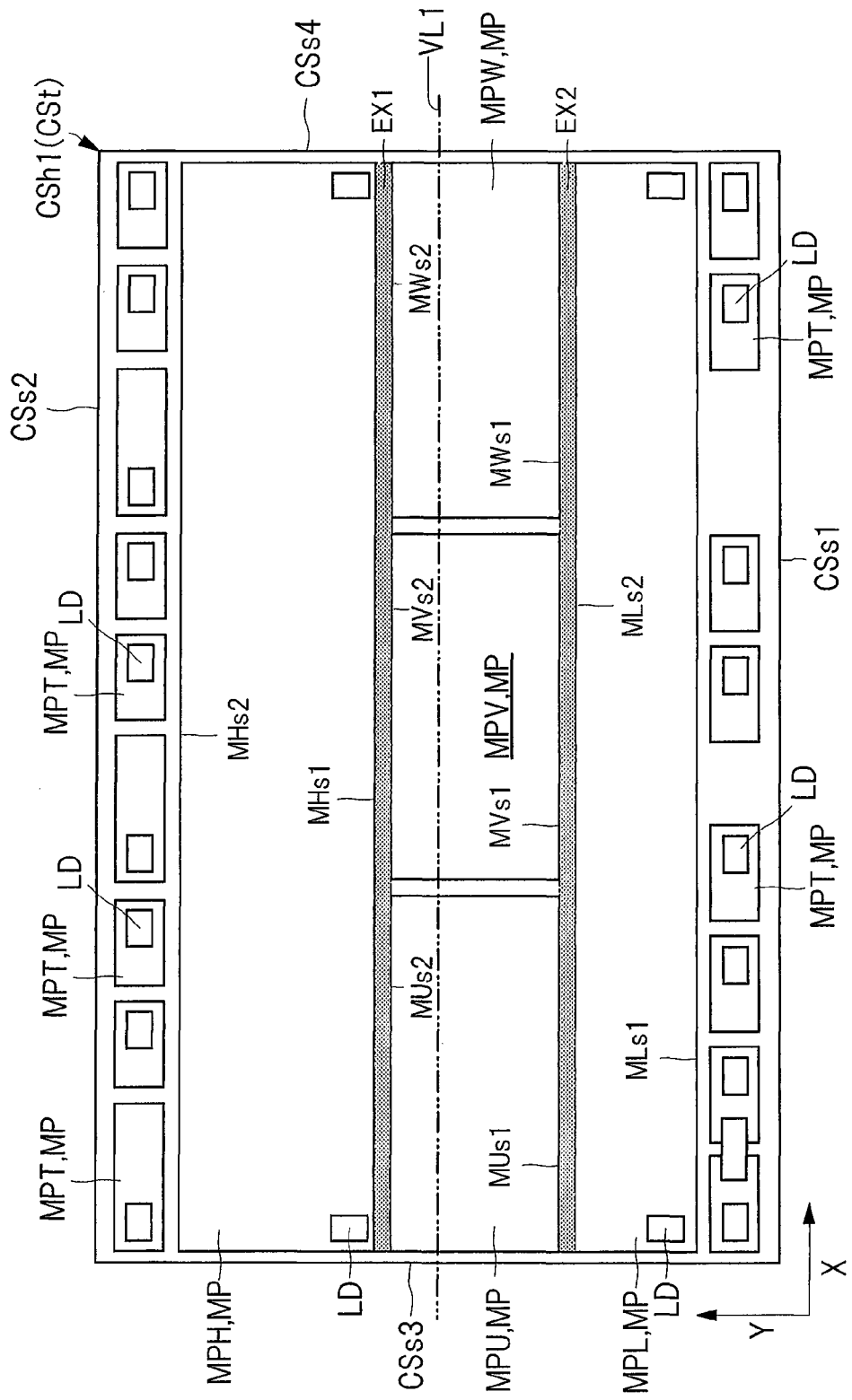
FIG. 14 is a plan view illustrating an examination example of FIG. 9.

Next, details of a planar shape of the metal patterns illustrated in FIG. 5 will be described. FIG. 9 is a plan view illustrating the layout of the plurality of metal patterns illustrated in FIG. 5. In addition, FIG. 14 is a plan view illustrating an examination example corresponding to FIG. 9. Also, FIG. 10 is a plan view illustrating a modification example corresponding to FIG. 9.

Figure 10:
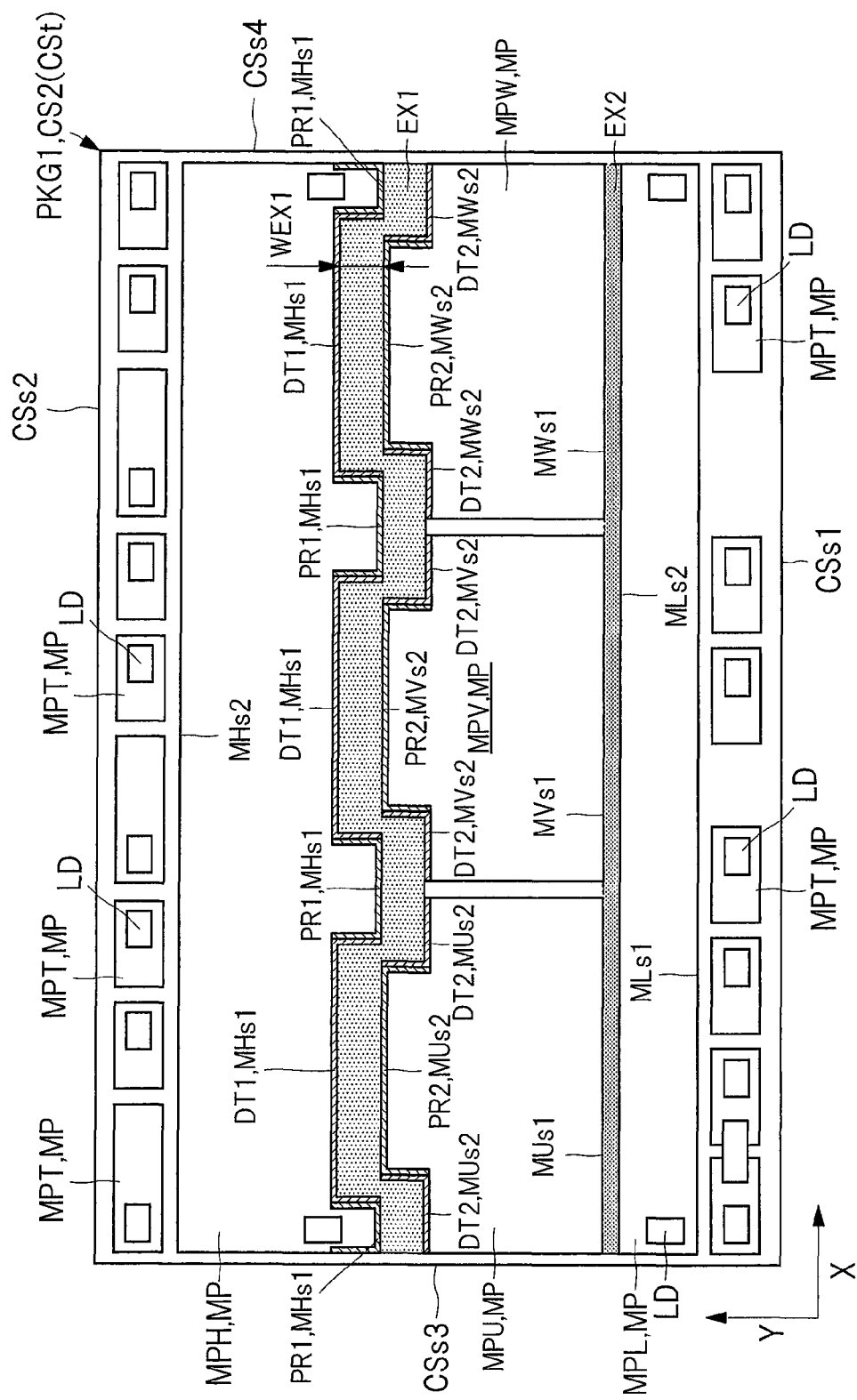
FIG. 10 is a plan view illustrating a modification example of FIG. 9.

Note that FIGS. 9, 10, and 14 illustrate a region EX1 and a region EX2 so that they are patterned in order to easily understand a range of a region which is exposed from the metal pattern. Also, FIGS. 9 and 10 illustrate a portion surrounding a convex portion and a concave portion facing the region EX1 and the region EX2 so that the hatching is added to the portion in order to clearly illustrate the range of the convex portion and the concave portion. The convex portion and the concave portion are regions surrounded by the portion to which the hatching is added in FIGS. 9 and 10.

First, in the present embodiment as described above, the metal pattern MPH (see FIG. 9) to which the high-side potential E1 (see FIG. 6) is supplied is integrally formed without being divided in accordance with the difference of the U-phase, the V-phase, and the W-phase. Further, the metal pattern MPL (see FIG. 9) to which the low-side potential E2 (see FIG. 6) is supplied is also integrally formed without being divided in accordance with the difference of the U-phase, the V-phase, and the W-phase as similar to the metal pattern MPH. Also, different potentials are supplied to the metal pattern MPU, the metal pattern MPV, and the metal pattern MPW, respectively, so that the patterns MPU, MPV, and MPW have a phase difference of 120 degrees as described above. Therefore, the metal pattern MPU, the metal pattern MPV, and the metal pattern MPW are divided from one another in accordance with the difference of the U-phase, the V-phase, and the W-phase.

Here, when the above-described configuration is simplified, a layout of the plurality of metal patterns MP and a planar shape thereof are as those of a ceramic substrate CSh1 of the examination example illustrated in FIG. 14. The ceramic substrate CSh1 is different from the ceramic substrate CS1 of the present embodiment illustrated in FIG. 9 in that sides extending along the X direction among the sides included in the plurality of respective metal patterns MP when seen in a plan view extend linearly.

Even in the case of the ceramic substrate CSh1, the metal pattern MPH is integrally formed without being divided in accordance with the difference of the U-phase, the V-phase, and the W-phase, and therefore, the electrical characteristics of the supply path of the potential E1 (see FIG. 6) can be improved as similar to the ceramic substrate CS1 illustrated in FIG. 9. Further, the heat generation amount in the metal pattern MPH can be reduced.

However, as a result of the study made by the inventors of the present application, in the case of the semiconductor device using the ceramic substrate CSh1, it has been found out that the ceramic substrate CSh1 is cracked by external force in the attachment of the semiconductor device. Specifically, it has been found out that the crack is easy to occur in the region EX1 exposed from the metal pattern MP which is provided between the metal pattern MPH illustrated in FIG. 14 and the metal patterns MPU, MPV, MPW, and proceeds so as to extend along the side MHs1 of the metal pattern MPH. Also, it has been found out that the crack is easy to occur in the region EX2 exposed from the metal pattern MP which is provided between the metal pattern MPL illustrated in FIG. 14 and the metal patterns MPU, MPV, MPW, and proceeds so as to extend along the side MHs2 of the metal pattern MPH.

On the other hand, it has been found out that the crack is difficult to occur in the region extending along the Y direction among the regions exposed from the metal pattern MP. For example, the crack is difficult to occur in the region provided among the metal pattern MPU, the metal pattern MPV, and the metal pattern MPW. Also, it has been found out that the crack is difficult to occur in the region between the side MHs2 of the metal pattern MPH and the plurality of metal patterns MPT and the region between the side MLs1 of the metal pattern MPL and the plurality of metal patterns MPT even in the region illustrated in FIG. 14 which is exposed from the metal pattern MP and which is extended linearly along the X direction.

From the above-described knowledge, it is considered that the crack is easy to occur in the region which is not covered by the metal pattern MP and which is extended linearly. Also, it is considered that the crack is easier to occur as the linearly-extended region is longer. Therefore, in a case of such a substrate having a long side and a short side as the ceramic substrate CSh1, it is preferable to build a countermeasure for suppressing the occurrence of the crack in the region extended along the extending direction (X direction in FIG. 14) of the long side (the substrate side CSs1 and the substrate side CSs2).

Further, even in the region extended in the X direction as described above, the crack is difficult to occur at a position close to any one of the substrate side CSs1 and the substrate side CSs2. Therefore, in a case with a plurality of regions extended in the X direction, the crack is easy to occur in an order of a relatively-close distance to a center line (virtual line VL1 illustrated in FIG. 14) connecting centers of the short sides (the substrate side CSs3 and the substrate side CSs4). That is, in the example illustrated in FIG. 14, the crack is the easiest to occur in the region EX1, and is the second easiest to occur in the region EX2.

Also, the crack is easy to occur when the semiconductor device is fixed to, for example, a heat sink, a supporting member, or others. As a force to be a cause of the occurrence of the crack, note that a force caused by variation in a fastening force depending on a fixing portion when the semiconductor device is fixed by, for example, a screw, is considered. When a through-hole THH for the fixing onto both ends in the longitudinal direction as illustrated in FIG. 3 is provided, the force caused by the variation in the fastening force acts mainly along the short side direction (Y direction in FIG. 14). However, when the fastening force is varied, a force that twists the ceramic substrate CSh1 in an out-of-plane direction acts. Therefore, the external force partially acts also in the long side direction.

Although illustration is omitted, when the metal patterns MPH and MPL are divided in accordance with the difference of the U-phase, the V-phase, and the W-phase as similar to the metal patterns MPU, MPV, and MPW, it has been found out that the crack is difficult to occur even in the regions EX1 and EX2. In consideration of this point, it is considered that the occurrence of the crack can be suppressed by dispersing the stress caused by the external force when the external force is applied.

Accordingly, the inventors of the present application have studied a technique of suppressing the occurrence of the crack in the region EX1 (and region EX2) and have found out the configuration of the present embodiment. That is, as illustrated in FIG. 9, the region EX1 provided to the ceramic substrate CS1 of the present embodiment extends so as to zigzag along the X direction which is the extending direction (longitudinal direction) of the metal pattern MPH. The region EX1 is a region which is provided between the metal pattern MPH and the metal patterns MPU, MPV, MPW and which is exposed from the metal pattern MP. When the region EX1 extends so as to zigzag, the stress is difficult to concentrate on a specific portion even if the external force is applied to the ceramic substrate CS1. That is, the stress can be dispersed. As a result, the occurrence of the crack in the region EX1 can be suppressed.

Also, in the example illustrated in FIG. 9, the region EX2 which is provided between the metal pattern MPL and the metal patterns MPU, MPV, MPW and which is exposed from the metal pattern MP extends so as to zigzag along the X direction which is the longitudinal direction of the ceramic substrate CS1. In this manner, the occurrence of the crack in the region EX2 can be suppressed.

The above-described wording "extend(s) so as to zigzag along the X direction" means that a line or a region does not linear extend in the X direction which is the extending direction but has a bent portion or a curved portion in the extending path. Therefore, the aspect in the description "the region EX1 (or region EX2) extends so as to zigzag along the X direction" includes not only the aspect of the extending so as to draw a square wave as illustrated in FIG. 9 but also various modification examples. For example, the region EX1 (or region EX2) may extend so as to wind along the X direction. Also, for example, the region EX1 (or region EX2) may extend so as to draw a triangle wave along the X direction.

Further, the configuration of the ceramic substrate CS1 of the present embodiment illustrated in FIG. 9 can be expressed as follows.

When seen in a plan view, the metal pattern MPH of the ceramic substrate CS1 of the present embodiment has a side MHs1 extending along the X direction and a side MHs2 located at an opposite side of the side MHs1. The side MHs1 and the side MHs2 are the long sides of the metal pattern MPH, respectively. In addition, the side MHs1 is a side facing each of the metal pattern MPU, the metal pattern MPV, and the metal pattern MPW, and the side MHs2 is a side facing the plurality of metal patterns MPT.

In addition, each of the metal pattern MPU, the metal pattern MPV, and the metal pattern MPW included in the ceramic substrate CS1 of the present embodiment is the metal pattern MP arranged between the metal pattern MPH and the metal pattern MPL. The metal pattern MPU, the metal pattern MPV, and the metal pattern MPW are arranged along the X direction so as to be side by side. In addition, the area of each of the metal pattern MPU, the metal pattern MPV, and the metal pattern MPW is relatively smaller than the area of the metal pattern MPH.

When seen in a plan view, the metal pattern MPU has a side MUs1 extending along the X direction and a side MUs2 located on an opposite side of the side MUs1. In addition, the side MUs1 is a side facing the metal pattern MPL, and the side MUs2 is a side facing the metal pattern MPH.

In addition, when seen in a plan view, the metal pattern MPV has a side MVs1 extending along the X direction and a side MVs2 located on an opposite side of the side MVs1. In addition, the side MVs1 is a side facing the metal pattern MPL, and the side MVs2 is a side facing the metal pattern MPH.

In addition, when seen in a plan view, the metal pattern MPW has a side MWs1 extending along the X direction and a side MWs2 located on an opposite side of the side MWs1. In addition, the side MWs1 is a side facing the metal pattern MPL, and the side MWs2 is a side facing the metal pattern MPH.

In addition, when seen in a plan view, the metal pattern MPL of the ceramic substrate CS1 of the present embodiment has a side MLs1 extending along the X direction and a side MLs2 located on an opposite side of the side MLs1. The sides MLs1 and MLs2 are the long sides of the metal pattern MPL, respectively. In addition, the side MLs2 is a side facing each of the metal pattern MPU, the metal pattern MPV, and the metal pattern MPW, and the side MLs1 is a side facing the plurality of metal patterns MPT.

Here, when seen in a plan view, the side MHs1 of the metal pattern MPH has a convex portion PR1 protruding toward the side MUs2 of the metal pattern MPU and a plurality of concave portions DT1 formed on both sides of the convex portion PR1. Also, when seen in a plan view, the side MHs1 of the metal pattern MPH has a convex portion PR1 protruding toward the side MVs2 of the metal pattern MPV and a plurality of concave portions DT1 formed on both sides of the convex portion PR1. Also, when seen in a plan view, the side MHs1 of the metal pattern MPH has a convex portion PR1 protruding toward the side MWs2 of the metal pattern MPW and a plurality of concave portions DT1 formed on both sides of the convex portion PR1.

Also, when seen in a plan view, the side MUs2 of the metal pattern MPU has a convex portion PR2 protruding toward the side MHs1 of the metal pattern MPH and a concave portion DT2 formed between the plurality of convex portions PR2. Also, when seen in a plan view, the side MVs2 of the metal pattern MPV has a convex portion PR2 protruding toward the side MHs1 of the metal pattern MPH and a concave portion DT2 formed between the plurality of convex portions PR2. Also, when seen in a plan view, the side MWs2 of the metal pattern MPW has a convex portion PR2 protruding toward the side MHs1 of the metal pattern MPH and a concave portion DT2 formed between the plurality of convex portions PR2.

In addition, the convex portion PR2 included in each of the metal pattern MPU, the metal pattern MPV, and the metal pattern MPW is arranged so as to protrude toward the region surrounded by the plurality of concave portions DT1 when seen in a plan view.

By providing the above-described configuration, the region EX1 provided to the ceramic substrate CS1 can extend so as to zigzag along the X direction which is the longitudinal direction of the ceramic substrate CS1.

In addition, in the example illustrated in FIG. 9, the convex portion PR2 included in each of the metal pattern MPU, the metal pattern MPV, and the metal pattern MPW is provided inside the region surrounded by the plurality of concave portions DT1 when seen in a plan view. In other words, when seen in a plan view, the plurality of convex portions PR1 are provided inside the plurality of concave portions DT2, and the plurality of convex portions PR2 are provided inside the plurality of concave portions DT1. In this manner, the following effects can be obtained. That is, as illustrated in FIG. 9, a width WEX1 of the region EX1 in the Y direction can be shortened. Therefore, as illustrated in FIG. 5, a length of the wire BW electrically connecting the semiconductor chip CTH which is the high-side switching element with each of the metal pattern MPU, the metal pattern MPV, and the metal pattern MPW can be shortened. Specifically, one end of the wire BW electrically connecting the semiconductor chip CTH with each of the metal pattern MPU, the metal pattern MPV, and the metal pattern MPW is bonded to the convex portion PR2 (see FIG. 9).

The ceramic substrate CS2 of the modification example illustrated in FIG. 10 is the same as the ceramic substrate CS1 illustrated in FIG. 9 in a point that the region EX1 extends so as to zigzag along the X direction which is the longitudinal direction of the ceramic substrate CS1. Therefore, the occurrence of the crack in the region EX1 can be suppressed. However, in paying attention on the width WEX1 of the region EX1 in the Y direction, the width WEX1 of the region EX1 in the ceramic substrate CS2 is larger than that of the region EX1 of the ceramic substrate CS1 illustrated in FIG. 9 since the convex portion PR2 is not provided inside the region surrounded by the concave portion DT1 when seen in a plan view.

When the width WEX1 is made small, the wire BW electrically connecting the semiconductor chip CTH with each of the metal pattern MPU, the metal pattern MPV, and the metal pattern MPW can be shortened as described above. In this case, in a circuit illustrated in FIG. 6, the impedance component of the transmission path connecting the high-side transistor Q1 with the output node can be reduced. Therefore, as illustrated in FIG. 9, by providing the convex portion PR2 inside the region surrounded by the concave portion DT1 when seen in a plan view, the impedance component of the transmission path connecting the high-side switching element with the output node can be reduced, so that the output from the inverter circuit can be stabilized. That is, the electrical characteristics of the inverter circuit can be improved.

Also, in paying attention on the viewpoint of the reduction in the impedance component of the transmission path connecting the high-side switching element with the output node, the following configuration is more preferable. That is, as illustrated in FIG. 5, it is preferable to electrically connect the semiconductor chip CTH with the metal pattern MPU through the plurality of wires BW, electrically connect the semiconductor chip CTH with the metal pattern MPV through the plurality of wires BW, and electrically connect the semiconductor chip CTH with the metal pattern MPW through the plurality of wires BW. The number of the wires BW is set to be plural as descried above, so that a cross-sectional area of the transmission path connecting the high-side switching element with the output node can be increased, and therefore, the impedance component can be reduced.

Note that the present embodiment describes the example of the usage of the wire BW as a member used for electrically connecting the semiconductor chip CP with the metal pattern MP. However, as a modification example, a bar-shaped metal (such as aluminum ribbon) can be used. Alternatively, they can be connected through a solder by using a patterned metal plate (copper clip). In this case, the impedance can be reduced more than that in the case of the usage of the plurality of wires BW.

Also, as described above, when the high-side switching element and the output node are electrically connected to each other through the plurality of wires BW, it is preferable to shorten the length of each wire BW. That is, as illustrated in FIG. 9, it is preferable to increase an area of the convex portion PR2. In the example illustrated in FIG. 9, the areas of the plurality of convex portions PR2 are larger than the areas of the plurality of convex portions PR1 of the metal pattern MPH, respectively. Therefore, a space for connecting the plurality of wires BW can be secured.

Further, by the above-described configuration, the occurrence of the crack can be suppressed in the region EX1 illustrated in FIG. 9. However, also in the region EX2, it is preferable to suppress the occurrence of the crack. Therefore, also for the region EX2, it is preferable to build the same countermeasure as that of the region EX1.

Specifically, when seen in a plan view, the side MUs1 of the metal pattern MPU has a convex portion PR3 protruding toward the side MLs2 of the metal pattern MPL and a concave portion DT3 formed between the plurality of convex portions PR3. Also, when seen in a plan view, the side MVs1 of the metal pattern MPV has a convex portion PR3 protruding toward the side MLs2 of the metal pattern MPL and a concave portion DT3 formed between the plurality of convex portions PR3. Further, when seen in a plan view, the side MWs1 of the metal pattern MPW has a convex portion PR3 protruding toward the side MLs2 of the metal pattern MPL and a concave portion DT3 formed between the plurality of convex portions PR3.

Still further, when seen in a plan view, the side MLs2 of the metal pattern MPL has a convex portion PR4 protruding toward the side MUs1 of the metal pattern MPU and a plurality of concave portions DT4 formed on both sides of the convex portion PR4. Also, when seen in a plan view, the side MLs2 of the metal pattern MPL has a convex portion PR4 protruding toward the side MVs1 of the metal pattern MPV and a plurality of concave portions DT4 formed on both sides of the convex portion PR4. Further, when seen in a plan view, the side MLs2 of the metal pattern MPL has a convex portion PR4 protruding toward the side MWs1 of the metal pattern MPW and a plurality of concave portions DT4 formed on both sides of the convex portion PR4.

Still further, when seen in a plan view, the plurality of convex portions PR4 included in the metal pattern MPL are arranged so as to protrude toward the concave portion DT3 included in each of the metal pattern MPU, the metal pattern MPV, and the metal pattern MPW.

By providing the above-described configuration, the region EX2 provided to the ceramic substrate CS1 can be extended so as to zigzag along the X direction which is the longitudinal direction of the ceramic substrate CS1.

Also, from the viewpoint of the shortening of the width of the region EX2, it is preferable to provide the plurality of convex portions PR4 included in the metal pattern MPL in the region surrounded by the concave portion DT3 included in each of the metal pattern MPU, the metal pattern MPV, and the metal pattern MPW. In this manner, the length of the wire BW electrically connecting the metal pattern MPL with the semiconductor chip CTL which is the low-side switching element illustrated in FIG. 5 can be shortened. That is, the impedance component of the transmission path to which the low-side potential E2 illustrated in FIG. 6 is inputted can be reduced.

In addition, in the example illustrated in FIG. 9, areas of the plurality of convex portions PR4 are larger than areas of the plurality of convex portions PR3. Therefore, the space for connecting the plurality of wires BW electrically connecting the semiconductor chip CTL and the metal pattern MPL can be secured.

Incidentally, as described above, it has been found out that the crack is easy to occur in the regions EX1 and EX2 illustrated in FIG. 14. However, the crack is difficult to occur in the region between the side MHs2 of the metal pattern MPH and the plurality of metal patterns MPT and the region between the side MLs1 of the metal pattern MPL and the plurality of metal patterns MPT.

Therefore, the region where the crack is difficult to occur, that is, the region between the side MHs2 of the metal pattern MPH and the plurality of metal patterns MPT and the region between the side MLs1 of the metal pattern MPL and the plurality of metal patterns MPT extend linearly along the X direction as illustrated in FIG. 9. In other words, each of the side MHs2 of the metal pattern MPH and the side MLs1 of the metal pattern MPL extends linearly along the X direction. The center line (virtual line VL1 illustrated in FIGS. 9 and 14) connecting the centers of the short sides (the substrate side CSs3 and the substrate side CSs4) of the ceramic substrate CS1 exists between the side MHs1 of the metal pattern MPH and the side MLs2 of the metal pattern MPL, and therefore, a distance of each of the side MHs2 and the side MLs1 to the virtual line VL1 is large.

In this manner, when one long side of the metal pattern MPH is formed so as to zigzag and the other long side thereof is formed linearly, the area of the metal pattern MPH can be increased. Alternatively, the semiconductor chip CTH and the semiconductor chip CD illustrated in FIG. 5 can be easily mounted, and therefore, the layout of the semiconductor chip CP on the metal pattern MPH can be facilitated. Meanwhile, when one long side of the metal pattern MPL is formed so as to zigzag and the other long side thereof is formed linearly, the area of the metal pattern MPL can be increased.

<Method of Manufacturing Semiconductor Device>

Figure 11:
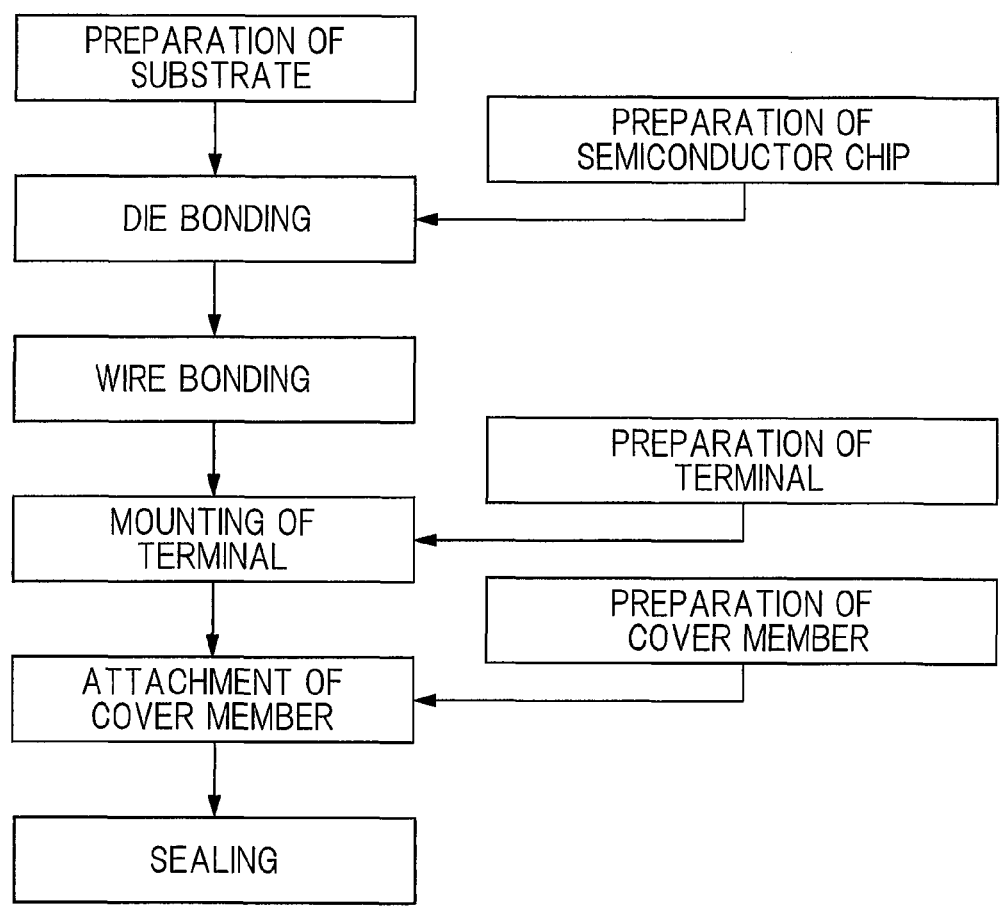
FIG. 11 is an explanatory diagram illustrating an assembly flow of the semiconductor device illustrated in FIG. 2.

Next, a process of manufacturing the semiconductor device PKG1 described with reference to FIGS. 1 to 10 will be described so as to follow a process flow illustrated in FIG. 11. FIG. 11 is an explanatory diagram illustrating an assembly flow of the semiconductor device illustrated in FIG. 2.

<Preparation of Substrate>

First, in a substrate preparing process illustrated in FIG. 11, the ceramic substrate illustrated in FIG. 9 is prepared. The ceramic substrate CS1 prepared in the present process is made of, for example, a ceramic containing alumina as a main component, and the plurality of metal patterns MP are bonded to the top surface CSt and the bottom surface CSb (see FIG. 4).

The plurality of metal patterns MP are made of, for example, a laminated film formed by laminating a nickel (Ni) film on a surface of a copper (Cu) film, and is directly bonded to the top surface CSt or the bottom surface CSb of the ceramic substrate CS1 by using the eutectic reaction. In addition, the nickel film is laminated on the copper film by an electroplating method.

Note that the overlap descriptions for the shape of the plurality of metal patterns MP and the layout thereof will be omitted since they have been already described.

<Die Bond>

Figure 12:
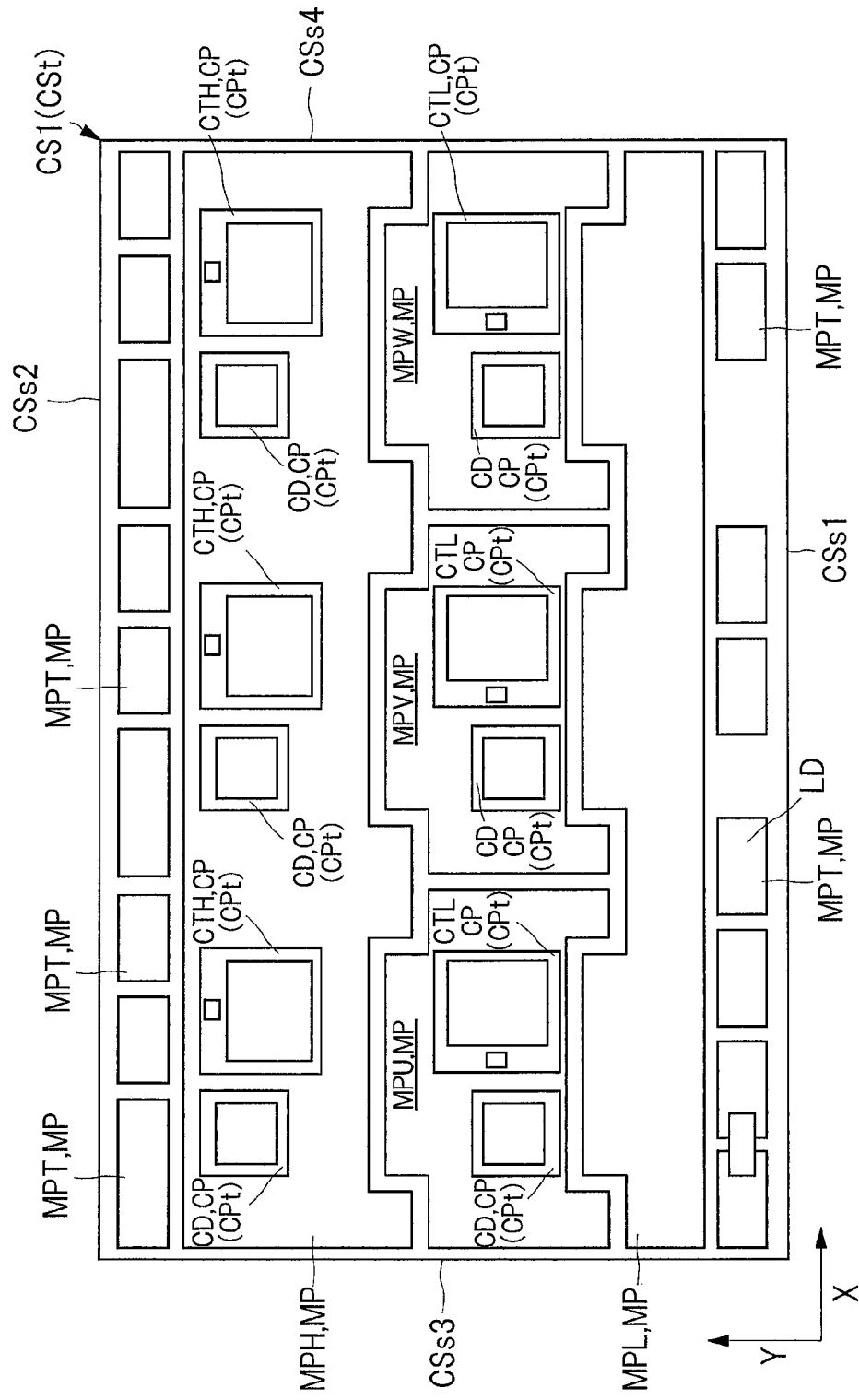
FIG. 12 is a plan view illustrating a state in which a plurality of semiconductor chips are mounted on a ceramic substrate in a die bond process illustrated in FIG. 11.

Next, in a die bond process illustrated in FIG. 11, as illustrated in FIG. 12, the plurality of semiconductor chips CP are mounted on the metal pattern MP of the ceramic substrate CS1. FIG. 12 is a plan view illustrating a state in which a plurality of semiconductor chips are mounted on the ceramic substrate in a die bond process illustrated in FIG. 11.

In the present process, a plurality of (three in the present embodiment) semiconductor chips CTH and a plurality (three in the present embodiment) of semiconductor chips CD are mounted on the metal pattern MPH, to which the high-side potential El (see FIG. 6) is supplied, among the plurality of metal patterns MP. In addition, one semiconductor chip CTL and one semiconductor chip CD are mounted on each of the metal patterns MPU, MPV, and MPW connected to the alternate-current power output terminal among the plurality of metal patterns MP. In addition, the semiconductor chip CP is not mounted on the metal pattern MPL, to which the low-side potential E2 (see FIG. 6) is supplied, among the plurality of metal patterns MP. In addition, the semiconductor chip CP is not mounted on the plurality of metal patterns MPT for connecting the input/output terminals LD (see FIG. 5) among the plurality of metal patterns MP.

In addition, as illustrated in FIG. 8, in the present process, each of the plurality of semiconductor chips CP is mounted by a so-called face-up mounting method in a state in which the bottom surface CPb of the semiconductor chip CP and the top surface of the metal pattern MP face each other. In addition, electrodes PDK and PDC are formed in the bottom surface CPb of the semiconductor chip CP, and the semiconductor chip CP is mounted through the solder SD in order to electrically connect the electrodes PDK and PDC and the metal pattern MP.

A method of mounting the semiconductor chip CP through the solder is performed as follows. First, a paste-like solder is applied on a region where the semiconductor chip is to be mounted. A solder component and a flux component are contained in the paste-like solder. Next, a plurality of semiconductor chips CP are prepared (in a semiconductor chip preparing process illustrated in FIG. 11), and each of the semiconductor chips is pressed against the solder. A reflow process (heating process) is performed on the solder in a state in which the plurality of semiconductor chips CP are temporarily bonded on the metal pattern MP through the paste-like solder. The solder is melted by the reflow process so that a part of the solder is connected to the metal pattern MP and another part of the solder is connected to the electrodes PDK and PDC of the semiconductor chip CP. Then, when the solder is cured by cooling, each of the semiconductor chips CP is fixed on the metal pattern MP.

When chip parts (electronic parts, functional elements, etc.) other than the semiconductor chip CP such as the chip capacitor in addition to the semiconductor chip CP are mounted, note that the chip parts can be mounted in batch in the present process.

<Wire Bond>

Figure 13:
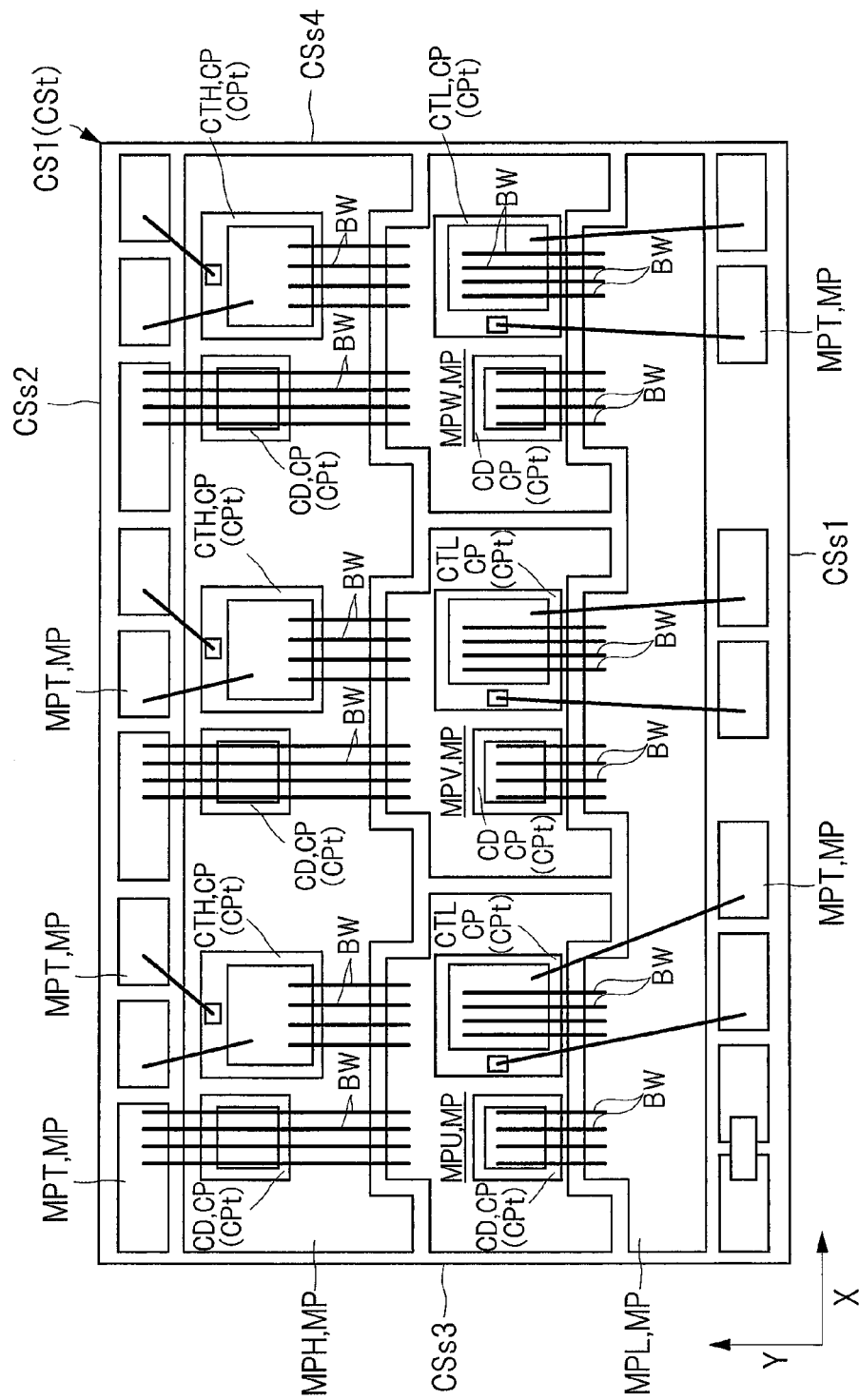
FIG. 13 is a plan view illustrating a state in which the plurality of semiconductor chips illustrated in FIG. 12 and a plurality of metal patterns are electrically connected to each other through a wire.

Next, in a wire bond process illustrated in FIG. 11, the semiconductor chip CP and the metal pattern MP are electrically connected to each other through the wire (conductive member) BW as illustrated in FIG. 13. FIG. 13 is a plan view illustrating a state in which the plurality of semiconductor chips illustrated in FIG. 12 and the plurality of metal patterns are electrically connected to each other through a wire (conductive member) BW.

In the present process, the emitter electrodes PDE (see FIG. 8) of the plurality of high-side semiconductor chips CTH and the plurality of metal patterns MPU, MPV, and MPW are electrically connected to one another through the plurality of wires BW, respectively. As described above, each of the plurality of wires BW is bonded to the convex portion PR2 illustrated in FIG. 9.

In addition, in the present process, the emitter electrodes PDE (see FIG. 8) of the plurality of low-side semiconductor chips CTL and the plurality of metal patterns MPL are electrically connected to one another through the plurality of wires BW, respectively. As described above, each of the plurality of wires BW is bonded to the convex portion PR4 illustrated in FIG. 9.

In addition, in the present process, the gate electrodes PDG (see FIG. 8) of the plurality of high-side semiconductor chips CTH and the gate electrodes PDG of the plurality of low-side semiconductor chips CTL are electrically connected to one another through the plurality of metal patterns MPT and wires BW, respectively.

In addition, in the present process, the anode electrodes PDA of the plurality of high-side semiconductor chips CD, the metal pattern MPU, the metal pattern MPV, and the metal pattern MPW, and the plurality of metal patterns MPT are electrically connected to one another through the plurality of wires BW, respectively. As illustrated in FIG. 13, a plurality of portions can be electrically connected to one another by one wire BW. In the example illustrated in FIG. 13, one end of the wire BW is connected to any one of the metal pattern MPU, the metal pattern MPV, and the metal pattern MPW first. At this time, an end of the wire BW is bonded to the convex portion PR2 illustrated in FIG. 9 as described above. Next, a middle portion of the wire BW is connected to the anode electrode PDA of the semiconductor chip CD. Next, the other end of the wire BW is connected to the metal pattern MPT.

In addition, in the present process, the anode electrodes PDA of the plurality of low-side semiconductor chips CD and the plurality of metal patterns MPT are electrically connected to one another through the plurality of wires BW, respectively.

Note that the present embodiment shows the example of the usage of the wire as the member electrically connecting the semiconductor chip CP and the metal pattern MP. However, as a modification example, a bar-shaped metal (for example, an aluminum ribbon) can be also used. Alternatively, they can be connected to each other through a solder by using a patterned metal plate (copper clip).

<Terminal Mounting>

Next, in a terminal mounting process illustrated in FIG. 11, a terminal LD is mounted on the plurality of metal patterns MP as illustrated in FIG. 5. The terminal LD is a lead terminal for electrically connecting the plurality of patterns to an external device not illustrated, and has one elongating end connected to the metal pattern MP. In the example illustrated in FIG. 4, each of the plurality of terminals LD is mounted on the metal pattern MP through the solder SD.

In addition, in the example illustrated in FIG. 5, the terminals LD are mounted on both ends in a longitudinal direction (the substrate side CSs3 side and the substrate side CSs4 side which are the short sides) in the metal pattern MPH to which the high-side potential is supplied and the metal pattern MPL to which the low-side potential is supplied, among the plurality of metal patterns MP. In addition, one terminal LD is mounted on each of the plurality of metal patterns MPT. In addition, the terminal LD is not connected to each of the metal pattern MPU, the metal pattern MPV, and the metal pattern MPW.

<Cover Member Attachment>

Next, in a cover member attaching process illustrated in FIG. 11, the cover member CV is adhered and fixed so as to cover the top surface CSt of the ceramic substrate CS1 as illustrated in FIG. 4. The peripheral portion of the top surface CSt of the ceramic substrate CS1 and the cover member CV are attached and fixed to each other through an adhesive BD1.

At this time, a plurality of through-holes THL are formed on a top surface CVt of the cover member CV, and the plurality of terminals LD are inserted into the plurality of through-holes THL, respectively.

In the example illustrated in FIG. 4, note that the cover member CV is integrally formed with a portion where the plurality of through-holes THL are formed and a portion that is adhered and fixed to the ceramic substrate CS1. However, as a modification example, the portion that is adhered and fixed to the ceramic substrate CS1 and the portion where the plurality of through-holes THL are formed may be provided as separable independent members. In this case, even when the layout of the terminals LD is changed, only the portion where the plurality of through-holes THL are formed may be replaced.

<Sealing>

Next, in a sealing process illustrated in FIG. 11, a sealing material MG is supplied into a space surrounded by the ceramic substrate CS1 and the cover member CV as illustrated in FIG. 4, and parts of each of the plurality of terminals LD, which are the plurality of semiconductor chips CP and the plurality of wires BW are sealed. The sealing material MG is a gel-like material. A through-hole not illustrated for supply is formed in a part of the cover member CV, and the gel-like sealing material MG is filled from the through-hole.

The semiconductor device PKG1 described with reference to FIGS. 1 to 10 can be obtained by the above-described processes. Then, the semiconductor device is subjected to necessary inspections and tests such as an appearance inspection or an electrical test, and is shipped. In addition, the semiconductor device is embedded in the power conversion system illustrated in FIG. 1.

MODIFICATION EXAMPLE

In the foregoing, the invention made by the present inventors has been concretely described based on the embodiments. However, it is needless to say that the present invention is not limited to the foregoing embodiments and various modifications and alterations can be made within the scope of the present invention. Note that some modification examples have been described also in the embodiments. However, representative modification examples other than the modification examples described above in the embodiments will be described.

Modification Example 1

For example, the above-described embodiments have described the power conversion circuit that outputs the three-phase alternate-current power by using three high-side transistors Q1 and three low-side transistors Q1 as the switching elements. However, the number of the switching elements has various modification examples.

For example, when a half-bridge circuit is configured by using one high-side transistor and one low-side transistor, single-layer alternate-current power can be output. In addition, when single-layer alternate-current is output by a full-bridge circuit, four transistors Q1 are used.

In this case, in order to reduce the impedance of the metal pattern MP to which the high-side potential is supplied, the plurality of switching elements are mounted on one metal pattern MP, and therefore, the length of one side of the metal pattern MP is large. Therefore, as described above in the embodiments, the region which faces the long side of the metal pattern MP and which is not covered by the metal pattern MP is formed so as to zigzag along the extending direction of the long side, so that the occurrence of the crack in the region can be suppressed.

Modification Example 2

In addition, for example, as the layout of the metal pattern MP on the ceramic substrate CS1, the above-described embodiments have described the aspect of the arrangement of the metal patterns MPU, MPV, and MPW between the high-side metal pattern MPH and the low-side metal pattern MPL so that they are side by side.

However, as a modification example, the metal pattern MPL for the low side may be provided between the metal pattern MPH for the high side and the metal patterns MPU, MPV, MPW arranged so that they are side by side along the X direction. In this case, it is preferable to provide the convex portion PR4 (see FIG. 9) and the concave portion DT4 (see FIG. 9) on both sides of the convex portion PR4 in the side MLs2 (see FIG. 9) facing the metal pattern MPH among the sides included in the metal pattern MPL for the low side. Also, it is preferable to extend the region which is provided between the metal pattern MPH and the metal pattern MPL and which is exposed from the metal pattern MP so as to zigzag along the extending direction of the metal pattern MPH.

In addition, it is preferable to provide a concave portion and a convex portion on both sides of the concave portion in a side (whose illustration is omitted) facing each of the metal patterns MPU, MPV, and MPW among the sides included in the metal pattern MPL for the low side.

Modification Example 3

Also, for example, while the various modification examples have been described as above, the combination of the modification examples with each other described above is applicable.

In addition, a part of the contents described in the embodiments will be described below.
(1) A method of manufacturing a semiconductor device includes: (a) a step of preparing a ceramic substrate having a first surface and a second surface located on an opposite side of the first surface, the first surface having a plurality of metal patterns thereon; (b) a step of mounting a plurality of first semiconductor chips on the first metal pattern among the plurality of metal patterns; and (c) a step of electrically connecting at least one or some of the plurality of first semiconductor chips with the second metal pattern among the plurality of metal patterns, and the plurality of metal patterns include: a first metal pattern which has a first side and on which a plurality of first semiconductor chips among the plurality of semiconductor chips are mounted; and a second metal pattern which has a second side facing the first side of the first metal pattern, and the first region which is provided between the first metal pattern and the second metal pattern and which is exposed from the plurality of metal patterns in the first surface of the ceramic substrate extends so as to zigzag along the first direction in which the first metal pattern extends.

What is claimed is:
1. A semiconductor device comprising:
a ceramic substrate having a first surface, and a second surface located on an opposite side of the first surface;
a plurality of metal patterns formed on the first surface of the ceramic substrate; and
a plurality of semiconductor chips mounted on one or more of the plurality of metal patterns,
wherein the plurality of metal patterns include:
a first metal pattern which has a first side and on which a plurality of first semiconductor chips among the plurality of semiconductor chips are mounted; and
a second metal pattern which has a second side facing the first side of the first metal pattern and which is separated from the first metal pattern,
wherein when seen in a plan view, the first side of the first metal pattern includes: a plurality of first convex portions protruding toward the second side of the second metal pattern; and a first concave portion formed between the plurality of first convex portions,
wherein when seen in a plan view, the second side of the second metal pattern includes: a second convex portion protruding toward the first side of the first metal pattern; and a plurality of second concave portions formed on both sides of the second convex portion,
wherein when seen in a plan view, the plurality of first convex portions are provided so as to respectively protrude toward the plurality of second concave portions, and the second convex portion is provided so as to protrude toward the first concave portion,
wherein the first surface of the ceramic substrate has: a first substrate side extending in a first direction; a second substrate side located on an opposite side of the first substrate side; a third substrate side extending in a second direction intersecting the first direction; and a fourth substrate side located on an opposite side of the third substrate side,
wherein each length of the first substrate side and the second substrate side is greater than each length of the third substrate side and the fourth substrate side, and
wherein each of the first side of the first metal pattern and the second side of the second metal pattern is provided along the first direction.
2. The semiconductor device according to claim 1,
wherein a first potential is supplied to the first metal pattern, and
a second potential which is different from the first potential is supplied to the second metal pattern.
3. The semiconductor device according to claim 1,
wherein, when seen in a plan view, the plurality of first convex portions are provided inside a region surrounded by the plurality of second concave portions, and the second convex portion is provided inside a region surrounded by the first concave portion.
4. The semiconductor device according to claim 3,
wherein at least one or more of the plurality of first semiconductor chips are electrically connected to the second metal pattern through a plurality of wires, and
each of the plurality of wires is bonded to the second convex portion of the second metal pattern.
5. The semiconductor device according to claim 4,
wherein an area of the second convex portion is greater than an area of each of the plurality of first convex portions.
6. The semiconductor device according to claim 1,
wherein the second metal pattern has a third side located on an opposite side of the second side,
the plurality of metal patterns include a third metal pattern which has a fourth side facing the third side of the second metal pattern and which is separated from the first metal pattern and the second metal pattern,
when seen in a plan view, the third side of the second metal pattern has a plurality of third convex portions protruding toward the fourth side of the third metal pattern and a third concave portion formed between the plurality of third convex portions, when seen in a plan view, the fourth side of the third metal pattern has a fourth convex portion protruding toward the third side of the second metal pattern and a plurality of fourth concave portions formed on both sides of the fourth convex portion, and the plurality of third convex portions are provided so as to protrude toward the plurality of fourth concave portions, and the fourth convex portion is provided so as to protrude toward the third concave portion.

7. The semiconductor device according to claim 6, wherein the plurality of first convex portions are provided inside a region surrounded by the plurality of second concave portions, and the second convex portion is provided inside a region surrounded by the first concave portion.

8. The semiconductor device according to claim 7, wherein at least one or more of the plurality of first semiconductor chips are electrically connected to the second metal pattern through a plurality of wires, and each of the plurality of wires is bonded to the second convex portion of the second metal pattern.

9. The semiconductor device according to claim 8, wherein an area of the second convex portion is greater than an area of each of the plurality of first convex portions.

10. The semiconductor device according to claim 6, wherein the plurality of metal patterns include a plurality of fourth metal patterns arranged between the first substrate side of the ceramic substrate and the first metal pattern, and a plurality of fifth metal patterns arranged between the second substrate side of the ceramic substrate and the third metal pattern, the first metal pattern has a fifth side which is located on an opposite side of the first side and which linearly extends along the first direction so as to face the plurality of fourth metal patterns, the third metal pattern has a sixth side which is located on an opposite side of the fourth side and which linearly extends along the first direction so as to face the plurality of fifth metal patterns, and a first virtual line connecting a center of the third substrate side and a center of the fourth substrate side of the ceramic substrate exists between the first side of the first metal pattern and the fourth side of the third metal pattern.

11. The semiconductor device according to claim 1, wherein the plurality of metal patterns include:

the first metal pattern to which a first potential is supplied;

a third metal pattern to which a second potential lower than the first potential is supplied; and a plurality of the second metal patterns which are provided between the first metal pattern and the third metal pattern, which are separated from each other, and to which a cyclically-changing potential is supplied, a plurality of first semiconductor chips among the plurality of semiconductor chips are mounted on the first metal pattern, a plurality of second semiconductor chips among the plurality of semiconductor chips are mounted on a plurality of the second metal pattern, respectively, when seen in a plan view, in the first side of the first metal pattern, the plurality of first convex portions and a plurality of the first concave portions are alternately arranged, and each of a plurality of the second metal patterns has the second convex portion of the second side protruding toward the first side of the first metal pattern and a plurality of the second concave portions formed on both sides of the second convex portion.

12. The semiconductor device according to claim 11, wherein the plurality of first convex portions are provided inside a region surrounded by a plurality of the second concave portions, and a plurality of the second convex portions are provided inside a region surrounded by a plurality of the first concave portions.

13. The semiconductor device according to claim 12, wherein the plurality of first semiconductor chips are electrically connected to a plurality of the second metal patterns through a plurality of wires, respectively, and each of the plurality of wires is bonded to the second convex portion included in each of a plurality of the second metal patterns.

14. The semiconductor device according to claim 13, wherein an area of the second convex portion is greater than an area of each of the plurality of first convex portions.

15. A semiconductor device comprising:

a ceramic substrate having a first surface, and a second surface located on an opposite side of the first surface;

a plurality of metal patterns formed on the first surface of the ceramic substrate; and a plurality of semiconductor chips mounted on one or more of the plurality of metal patterns, wherein the plurality of metal patterns include:

a first metal pattern which has a first side, on which a plurality of first semiconductor chips among the plurality of semiconductor chips is mounted, and to which a first potential is supplied; and a second metal pattern which has a second side facing the first side of the first metal pattern and to which a second potential different from the first potential is supplied, wherein when seen in a plan view, a first region which is provided between the first metal pattern and the second metal pattern and which is exposed from the plurality of metal patterns in the first surface of the ceramic substrate extends so as to zigzag along a first direction in which the first metal pattern extends, wherein the first surface of the ceramic substrate has: a first substrate side extending in the first direction; a second substrate side located on an opposite side of the first substrate side; a third substrate side extending in a second direction intersecting the first direction; and a fourth substrate side located on an opposite side of the third substrate side, and wherein each length of the first substrate side and the second substrate side is greater than each length of the third substrate side and the fourth substrate side.

16. The semiconductor device according to claim 15, wherein the second metal pattern has a third side located on an opposite side of the second side, the plurality of metal patterns include a third metal pattern which has a fourth side facing the third side of the second metal pattern and which is separated from the first metal pattern and the second metal pattern, and a second region which is provided between the second metal pattern and the third metal pattern and which is exposed from the plurality of metal patterns in the first surface of the ceramic substrate extends so as to zigzag along the first direction.

17. The semiconductor device according to claim 16,
wherein the plurality of metal patterns include a plurality of fourth metal patterns arranged between the first substrate side of the ceramic substrate and the first metal pattern, and a plurality of fifth metal patterns arranged between the second substrate side of the ceramic substrate and the third metal pattern,
the first metal pattern has a fifth side which is located on an opposite side of the first side and which linearly extends along the first direction so as to face the plurality of fourth metal patterns,
the third metal pattern has a sixth side which is located on an opposite side of the fourth side and which linearly extends along the first direction so as to face the plurality of fifth metal patterns, and
a first virtual line connecting a center of the third substrate side and a center of the fourth substrate side of the ceramic substrate exists between the first side of the first metal pattern and the fourth side of the third metal pattern.

* * * * *